(12) United States Patent
Donnelly et al.

(10) Patent No.: US 12,094,879 B2
(45) Date of Patent: Sep. 17, 2024

(54) MOS DEVICES FOR SENSING TOTAL IONIZING DOSE

(71) Applicant: Apogee Semiconductor, Inc., Plano, TX (US)

(72) Inventors: Emily Ann Donnelly, Whitesboro, TX (US); Mark Hamlyn, Murphy, TX (US); Kyle Schulmeyer, Salida, CO (US); Gregory A. Magel, Dallas, TX (US)

(73) Assignee: Apogee Semiconductor, Inc., Plano, TX (US)

( * ) Notice: Subject to any disclaimer, the term of this patent is extended or adjusted under 35 U.S.C. 154(b) by 202 days.

(21) Appl. No.: 17/934,871

(22) Filed: Sep. 23, 2022

(65) Prior Publication Data

US 2024/0105721 A1    Mar. 28, 2024

(51) Int. Cl.
*H01L 27/092* (2006.01)
*G01T 1/02* (2006.01)
*H01L 21/8234* (2006.01)
*H01L 27/088* (2006.01)

(52) U.S. Cl.
CPC ............ *H01L 27/092* (2013.01); *G01T 1/026* (2013.01); *H01L 21/823425* (2013.01); *H01L 27/088* (2013.01)

(58) Field of Classification Search
CPC ............. G01T 1/026; H01L 21/823425; H01L 27/088; H01L 27/092
See application file for complete search history.

(56) References Cited

U.S. PATENT DOCUMENTS

| 5,830,790 A | * | 11/1998 | Kim | ...................... H01L 27/088 257/E27.06 |
| 6,441,440 B1 | | 8/2002 | Brady et al. | |
| 6,665,161 B1 | | 12/2003 | Brady et al. | |

(Continued)

OTHER PUBLICATIONS

Shaneyfelt et al., Challenges in Hardening Technologies Using Shallow-Trench Isolation, IEEE Transactions on Nuclear Science, vol. 45, No. 6, Dec. 1998, pp. 2584-2592.

(Continued)

*Primary Examiner* — Mark R Gaworecki
(74) *Attorney, Agent, or Firm* — Gregory A. Magel

(57) ABSTRACT

Devices with increased susceptibility to ionizing radiation feature multiple parasitic transistors having leakage currents that increase with total ionizing dose (TID) due to negative threshold shifts from radiation-induced charge buildup in the field oxide. Leakage currents of parasitic edge transistors associated with active region sidewalls under a gate are enhanced using branching gate patterns that increase the number of these sidewalls. Other variations combine parasitic edge transistors with parasitic field transistors formed under the field oxide between active regions, or between n-wells and active regions. Arrays of such devices connected in parallel further multiply leakage currents, while novel compact designs increase the density and hence the sensitivity to TID for a given circuit area. These NMOS-based radiation-intolerant devices can be integrated with more radiation-tolerant CMOS integrated circuits using commercial processes, to produce circuits having a level of radiation intolerance required for export, or to be used as dosimeters.

19 Claims, 18 Drawing Sheets

(56) References Cited

U.S. PATENT DOCUMENTS

| | | |
|---|---|---|
| 6,762,128 B2 | 7/2004 | Bernkopf et al. |
| 6,794,733 B1 | 9/2004 | Brady et al. |
| 6,969,859 B2 | 11/2005 | Klaasen et al. |
| 8,575,560 B1 | 11/2013 | Fechner |
| 9,275,747 B2 | 3/2016 | Baumann et al. |
| 2006/0197108 A1* | 9/2006 | Gardner ............... H01L 29/402 257/E27.062 |

OTHER PUBLICATIONS

Schwank et al., Radiation Effects in MOS Oxides, IEEE Transactions on Nuclear Science, vol. 55, No. 4, Aug. 2008, pp. 1833-1853.
Barnaby, Total-Ionizing-Dose Effects in Modern CMOS Technologies, IEEE Transactions on Nuclear Science, vol. 53, No. 6, Dec. 2006, pp. 3103-3121.
Dawes et al., An IC Compatible Ionizing Radiation Detector, IEEE Transactions on Nuclear Science, vol. NS-28, No. 6, Dec. 1981, pp. 4152-4155.
Lipovetzky et al., Field Oxide n-channel MOS Dosimeters Fabricated in CMOS Processes, IEEE Transactions on Nuclear Science, vol. 60, No. 6, Dec. 2013, pp. 4683-4691.

\* cited by examiner

MOS DEVICES FOR SENSING TOTAL IONIZING DOSE

BACKGROUND OF THE INVENTION

1. Field of the Invention

The present invention relates generally to sensing ionizing radiation, and, more particularly, to MOS devices having an increased sensitivity to total ionizing dose that can be integrated with CMOS integrated circuits.

2. Description of the Related Art

Complementary Metal-Oxide Semiconductor (CMOS) and Bipolar CMOS (BiCMOS) integrated circuits (ICs) that are used in a variety of aerospace, medical, nuclear power, and military systems can be affected in a number of ways when exposed to ionizing radiation in those environments. Much effort has gone into improving the radiation hardness of CMOS ICs for operation in such environments. Transient single-event effects can often be mitigated using circuit and system redundancy techniques. Cumulative effects of exposure over time, however, can lead to device degradation and failure, reducing system lifetime. A semiconductor device is termed "radiation hard" if it can continue to function within specifications after exposure to a specified amount of radiation. Absorbed dose (energy per unit mass) from the exposure to ionizing radiation is quantified using a metric called Total Ionizing Dose (TID).

Special fabrication processes can be used to harden the materials and structures in ICs, but are expensive and limited to use in cost-insensitive applications, as well as limiting performance compared to advanced commercially-available ICs. For example, there has been a typical 7-year performance gap between space-qualified and commercially-available microprocessors. IC design techniques, called hardness-by-design, such as using special transistor layouts, can help reduce these cumulative effects due to TID without requiring special processes, and can be applied to critical portions of a circuit. Even without special fabrication or design techniques, the evolution of commercial technology such as scaling to smaller dimensions and thinner gate oxides, can lead to ICs that are more tolerant to ionizing radiation in some ways, or in some specific portions of the circuits, than those from older generations.

Circuits that are radiation-hardened, either by design or by accident, may still deteriorate and malfunction at a certain level of TID. This level can be found by testing, and if the level is found to be too high, it may trigger Department of Defense export restrictions. It would be useful to have on-chip integrated TID sensors that can be used to report the current accumulated level of TID, either to predict an upcoming malfunction, or to be used to proactively disable a functional circuit when it reaches a certain TID in order to specify or rate the circuit at a lower level of radiation hardness than it inherently possesses, so that it can be freely sold and exported. Such integrated TID sensors should have a higher level of sensitivity to TID than the main functional circuits they are protecting or disabling, so that they can be used predictively or proactively as just described. It is also desirable that the TID sensors take up a minimum circuit area from the functional area while exhibiting this high sensitivity.

Sensors having a predictable response to TID that can be integrated with more radiation-tolerant circuitry also open the possibility of integrating readout and control electronics, and also potentially wireless communications, for fabrication of a dosimetry system on a single chip.

There thus remains a need for devices with high sensitivity to TID that can be fabricated in a standard CMOS process, and that make efficient use of circuit area.

SUMMARY OF THE INVENTION

The present invention addresses the need for semiconductor sensors for total ionizing dose (TID) that have enhanced sensitivity and that can be integrated with more radiation-tolerant (rad-hard) CMOS integrated circuits using IC layout techniques, without requiring changes to the CMOS fabrication process to make the sensor devices. Embodiments of the present invention can be used as dosimeters integrated with rad-hard IC processing or communication circuitry, or to provide a signal to shut down a relatively rad-hard IC at a lower level of TID exposure than it would inherently cease to function, in order to conform to Department of Defense export restrictions and permit commercial and international sales. Sensitivity to TID is enhanced by novel designs that increase the number and types of parasitic transistors associated with NMOS transistor layouts, and by incorporating these types of devices into arrays having compact layouts.

More specifically, the present invention provides a MOS device for sensing TID formed on a top surface of a silicon substrate, and having an active region surrounded by a field oxide region. A gate electrode (herein referred to simply as "gate") is formed using a gate pattern that branches within the active region to cross the boundary between the active region and the field oxide region at multiple locations and divide the regions along the boundary into a number of diffusion regions. NMOS transistor drains and sources are formed in the diffusion regions, and parasitic edge transistors are formed along the boundary underneath the gate between each drain-source pair. These parasitic edge transistors act in parallel with the regular ("as-drawn") gate oxide transistor formed by the gate, drains, and sources, and contribute excess leakage currents to that of the regular gate oxide transistor. A device layout that has a greater number of gate branches crossing the active region boundary between drains and sources has a greater number of parasitic edge transistors and thus higher total excess leakage current. Increased sensitivity to TID in the form of increased leakage current for the same level of TID exposure is thereby achieved.

The present invention also provides a MOS device for sensing TID that not only includes at least one parasitic edge transistor as just described, but also is configured to realize at least one parasitic field transistor in which a field gate is formed between the first active region having parasitic edge transistors and a second region, separated by field oxide from the first active region, that serves as a drain or source for the parasitic field transistor. The field gate can be polysilicon or metal, and either an extension of the gate from the first active region, or a separate gate conductor connected to the same potential as the gate in the first active region so that the parasitic field transistor also acts in parallel with the gate oxide transistor and parasitic edge transistor. The second region can be a second active region having a second gate contiguous with the gate in the first active region, with either a pair of sources on either side of the second gate where it crosses the second region boundary to join the field gate, in which case the first active region has a pair of drains on either side of the gate contiguous with the field gate to complete the field transistor; or a pair of drains on either side of the second gate where it joins the field gate, in which case the first active region has a pair of sources on either side of the gate where it joins the field gate. Alternatively, the second region can be an n-well over which the field gate at least partly extends, to create a parasitic field transistor between the n-well, which can act as a drain, and the first active region, which has a pair of sources on either side of the gate where it joins the field gate to act as a source to complete the field transistor. The field gate can also be formed in a metal layer over the field oxide layer between the first active region and the second region, which does not require either a pair of drains or a pair of sources, but can be formed between a single drain (or n-well) and a single source. The field gate dimensions and material can be adjusted, as can the number and dimensions of the parasitic edge transistors and regular gate oxide transistor, in order to tailor the response of the device to TID.

An array of sensors constructed according to the principles of this disclosure is also provided, in which two or more sensors of the types briefly summarized above are connected electrically in parallel either by making the gates of neighboring sensors contiguous or by using other conductive layers to connect the drains, sources, and/or gates of the sensors, whereby leakage currents contributed by the sensors in the array add in parallel, increasing the sensitivity to TID. The array may be a linear or two-dimensional array, or otherwise shaped to fit a predetermined area. Both parasitic edge transistors and parasitic field transistors can be realized in the array depending on the details of the sensors in the array and their arrangement. The proportion of edge transistors to field transistors can be varied by the design of the sensors and their distribution within the array, so as to advantageously combine the differing responses of the gate oxide and parasitic transistors to exposure, time, and temperature in order to tailor the overall TID response of the array.

Also provided is a MOS device for sensing TID in which a plurality of gates elongated in a column direction cross a plurality of substantially parallel active regions elongated in a row direction and spaced out along the column direction, separated by field oxide regions. Drains and sources alternate along the active region rows and also in the column direction so as to distribute the drains and sources in a checkerboard pattern. The gates, drains, and sources are connected to each other and to respective gate, drain and source terminals with interconnects in such a way as to act in parallel as a gate oxide transistor. Parasitic edge transistors are formed under the gates between each drain-source pair along the edges of the boundaries between the active regions and the field oxide regions, and act in parallel with the gate oxide transistor, adding their leakage currents together. The interconnects of the drains and sources may be implemented as a diagonal lattice in one metal layer for the drains and a shifted diagonal lattice in another metal layer for the sources, providing a low-resistance and redundant interconnect. The device may be laid out using minimum design rules with no extra space between adjacent rows and columns so as to maximize edge leakage currents and achieve high TID sensitivity per unit area.

In an alternative embodiment, the drains and sources can be arranged in pairs along the active region, and instead of alternating individually, alternating in pairs around alternate gates along the row direction, and further alternating in pairs in the column direction along the gates. Parasitic edge transistors are still formed along active region boundaries between drains and sources, i.e., between pairs in the row direction. In this embodiment, parasitic field transistors are also realized under gates between pairs of drains and pairs of sources in the column direction. A compact array is thus provided in which leakage currents from an extended large gate oxide transistor, a number of parasitic edge transistors, and a number of parasitic field transistors all add in parallel to make a device highly sensitive to TID. Gates in columns along pairs of drains and sources can be widened to increase the leakage contribution due to the parasitic field transistors, at the expense of increasing the area of the device.

Other features and advantages of the present invention will be apparent to those of ordinary skill in the art upon reference to the following detailed description taken in conjunction with the accompanying drawings, which are to be understood to be exemplary and explanatory, and are intended to provide further explanation of the invention as claimed.

DETAILED DESCRIPTION OF THE PREFERRED EMBODIMENTS

Figure 1A:
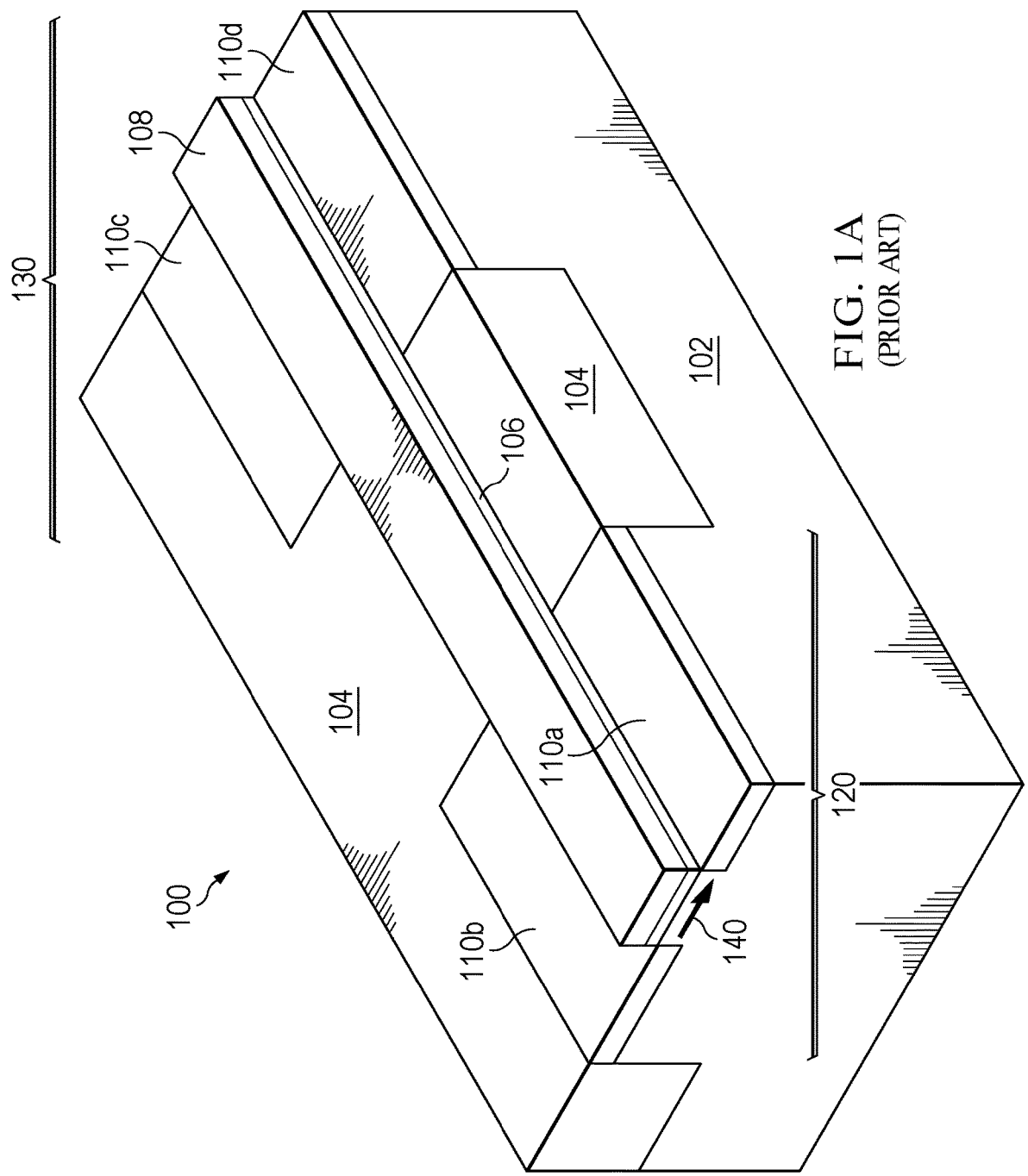
FIG. 1A is an isometric cross-sectional view of a portion of a prior art integrated circuit, showing a leakage current path due to a parasitic edge transistor.

The following Detailed Description is merely exemplary in nature and is not intended to limit the various embodiments or the application and uses thereof. Furthermore, there is no intention to be bound by any theory presented in the preceding background or the following detailed description. The techniques and structures described below may be applied in fields and applications beyond those specified here as examples, and the disclosed invention is therefore not to be considered limited to the applications and examples used here for the sake of explaining its principles of operation.

Well known in the present art are the designations "p−", "p", and "p+" to describe ranges of doping concentrations of p-type dopants, and "n−", "n", and "n+" to describe ranges of doping concentrations of n-type dopants, where "p−" and "n−" refer to doping concentrations in a range of approximately $10^{14}$-$10^{16}$ cm$^{-3}$, "p" and "n" refer to concentrations of $10^{16}$-$10^{19}$ cm$^{-3}$, and "p+" and "n+" refer to concentrations of $10^{19}$-$10^{21}$ cm$^{-3}$. These dopant concentrations can be introduced into the substrate by a number of different processes, but highly-doped regions such as transistor drain and source regions are conventionally referred to as "diffusion regions," even though in modern processes, these regions are more commonly fabricated not by diffusion, but by more-controllable ion implantation.

Ionizing radiation produces several effects in CMOS integrated circuits, affecting different structures and devices in various ways, and leading to cumulative (TID) effects on device performance. One of the most important TID effects in CMOS circuits is the increase in the off-current (leakage current) in n-channel (NMOS) devices. This is caused by a buildup of trapped positive charge in oxide insulators used to isolate the devices (field oxide), due to trapping of holes from electron-hole pairs generated by energy deposited by particles of ionizing radiation passing through the device area, or the formation of interface traps via reactions involving hydrogen. Trapped positive charge in gate oxide under the gate in an "as-drawn" device (i.e., in the intentional mask layout of a regular NMOS transistor, which will be referred to herein as a "gate oxide transistor") can begin to invert an n-channel under the gate, partially turning it on and increasing a drain-to-source leakage current. But in modern CMOS technologies having very thin gate oxides, radiation-induced charge buildup in the oxide directly under the gate is small, and TID effects are dominated by oxide-trapped charge buildup in the thicker field oxides surrounding the as-drawn gate oxide transistor. Charge buildup in field oxides creates leakage paths in parasitic transistors whose leakage currents add in parallel with those of the gate oxide transistor, but can be larger, because trapped oxide charge can shift the threshold voltage of the parasitic transistors associated with field oxides sufficiently to start turning them on.

Two common types of field oxide isolation in use are local oxidation of silicon (LOCOS) and shallow-trench isolation (STI). Both types are susceptible to the parasitic leakage effects described herein. The concepts of the present invention can be implemented in embodiments using either type of field oxide isolation technology. By way of example, a simplified isometric cross-section of a portion of a prior art CMOS integrated circuit 100 fabricated using shallow-trench isolation technology is illustrated in FIG. 1A, showing a primary leakage path 140 associated with an NMOS transistor 120. Substrate 102 is lightly-doped p-type (p−) silicon or epi, or may be a p-well in which neighboring MOS transistors 120 and 130 are formed. The transistors are separated by STI field oxide 104 to isolate between them. The areas in which transistors are formed are surrounded by field oxide 104, and are called "active regions," in which highly-doped n+ diffusion regions are formed to define MOSFET drains and sources. MOS transistors 120 and 130 are laid out using a self-aligned gate process such that gate 108 serves as a mask for etching gate oxide 106 as well as for defining n+ diffusion regions 110*a* and 110*b* on either side of gate 108 in NMOS transistor 120 and diffusion regions 110*c* and 110*d* in transistor 130. Diffusion regions 110*a* through 110*d* can be drains or sources since they are symmetrical, but by convention a source terminal is at a lower voltage. Thus in FIG. 1A, diffusion regions 110*c* and 110*d* are not identified as drain or source, but a leakage current 140 is shown flowing from region 110*b* to 110*a*, which identifies region 110*a* as an NMOS source, and region 110*b* as a drain.

Transistor 120 is sectioned at the lower left of FIG. 1A along an interface between field oxide 104 (removed portion not shown) and the active region of transistor 120 in which drain 110*b* and source 110*a* are formed. Leakage path 140 runs from drain 110*b* to source 110*a* in the lightly-doped silicon along the sidewall of the STI field oxide (FOX) 104 (removed in the diagram on the side of the section toward the viewer), underneath gate 108, since charge buildup in the FOX 104 partially inverts this leakage path 140, which can be turned on by a positive bias on gate 108. This creates what is referred to herein as a "parasitic edge transistor," of which there are two associated with each prior art as-drawn gate oxide transistor, one along each FOX sidewall where gate 108 passes over a boundary between FOX 104 and the active region. Leakage path 140 will be referred to herein as an "edge leakage" path.

Figure 1B:
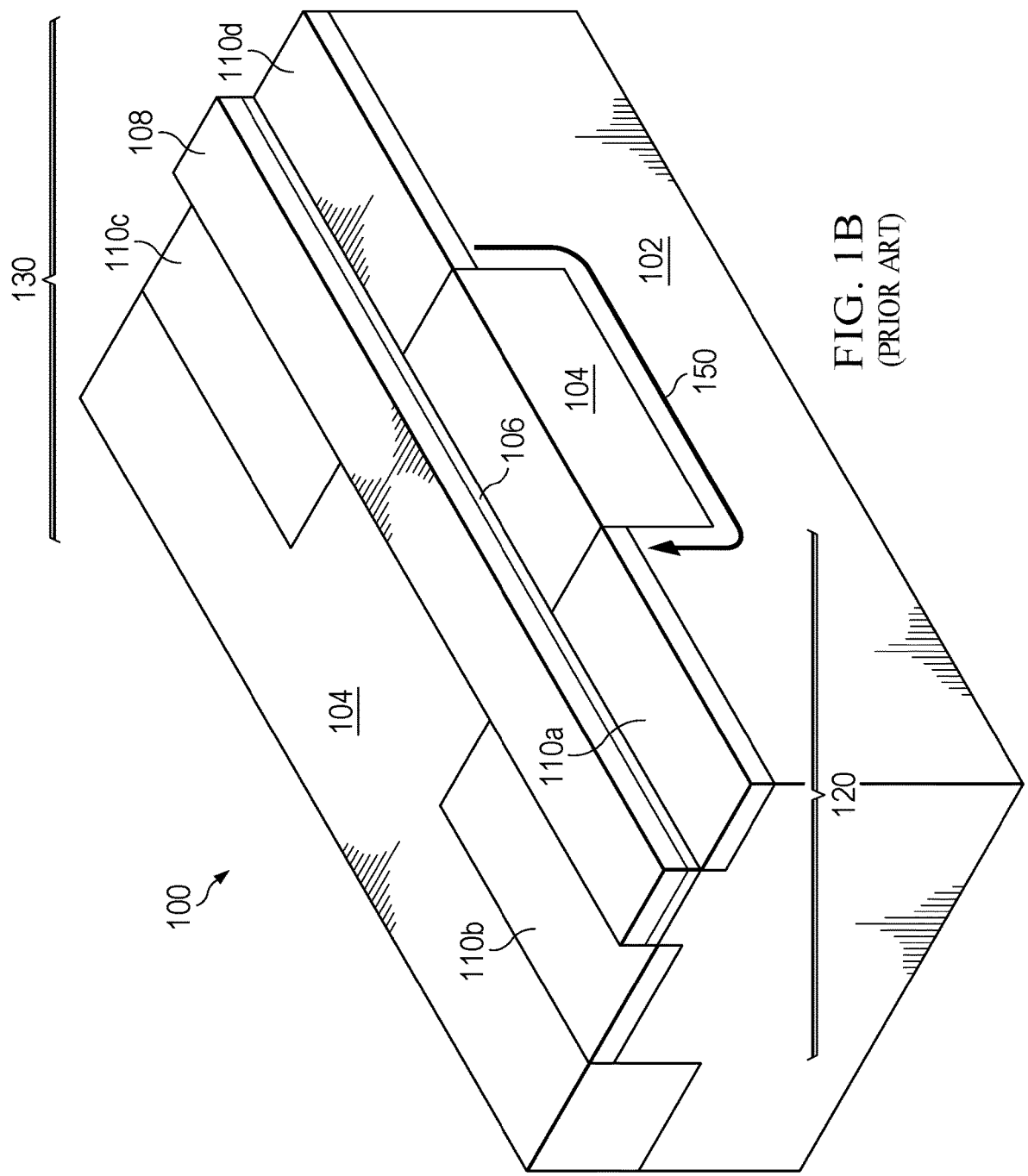
FIG. 1B is an isometric cross-sectional view of a portion of a prior art integrated circuit, showing a leakage current path due to a parasitic field transistor formed between NMOS transistors.

Now referring to FIG. 1B, the same portion of CMOS integrated circuit 100 is shown, in which a different leakage path 150 is illustrated between NMOS transistor 130 and neighboring NMOS transistor 120. Leakage path 150 flows from drain 110*d* of NMOS transistor 130 to source 110*a* of NMOS transistor 120. This leakage path is formed by gate 108 passing over field oxide 104, which shall be referred to herein as a "field gate," and which together with regular gate oxide 106 acts as a thick gate oxide for what is referred to herein as a "parasitic field transistor." Charge buildup in the thick field oxide lowers the threshold voltage of this parasitic field transistor below that of the gate oxide transistor, leading to an increased leakage current. The leakage path 150 is illustrated in FIG. 1B as running along the bottom right cut face of the 3-D cross-section, but in reality, it is concentrated along a path directly underneath gate 108 where the potential is highest. This type of leakage path, referred to herein as a "field leakage" path, can run between any two neighboring NMOS transistors as long as the potential of one transistor, e.g., transistor 130, is higher than its neighbor, e.g., transistor 120. The direction of current flow is from higher to lower potential, most commonly from a drain to a source. To increase the field leakage, layouts can be intentionally made having two drains on either side of the gate on one side of a FOX stripe connected to a high potential (such as $V_{DD}$), and two sources connected to a low potential (such as $V_{SS}$ or ground) on either side of the gate on the other side of the FOX (i.e., on the other end of the field gate). In FIG. 1B, this would be the case if diffusion regions 110c and 110d were both drains, and 110a and 110b were both sources connected as just described.

Figure 1C:
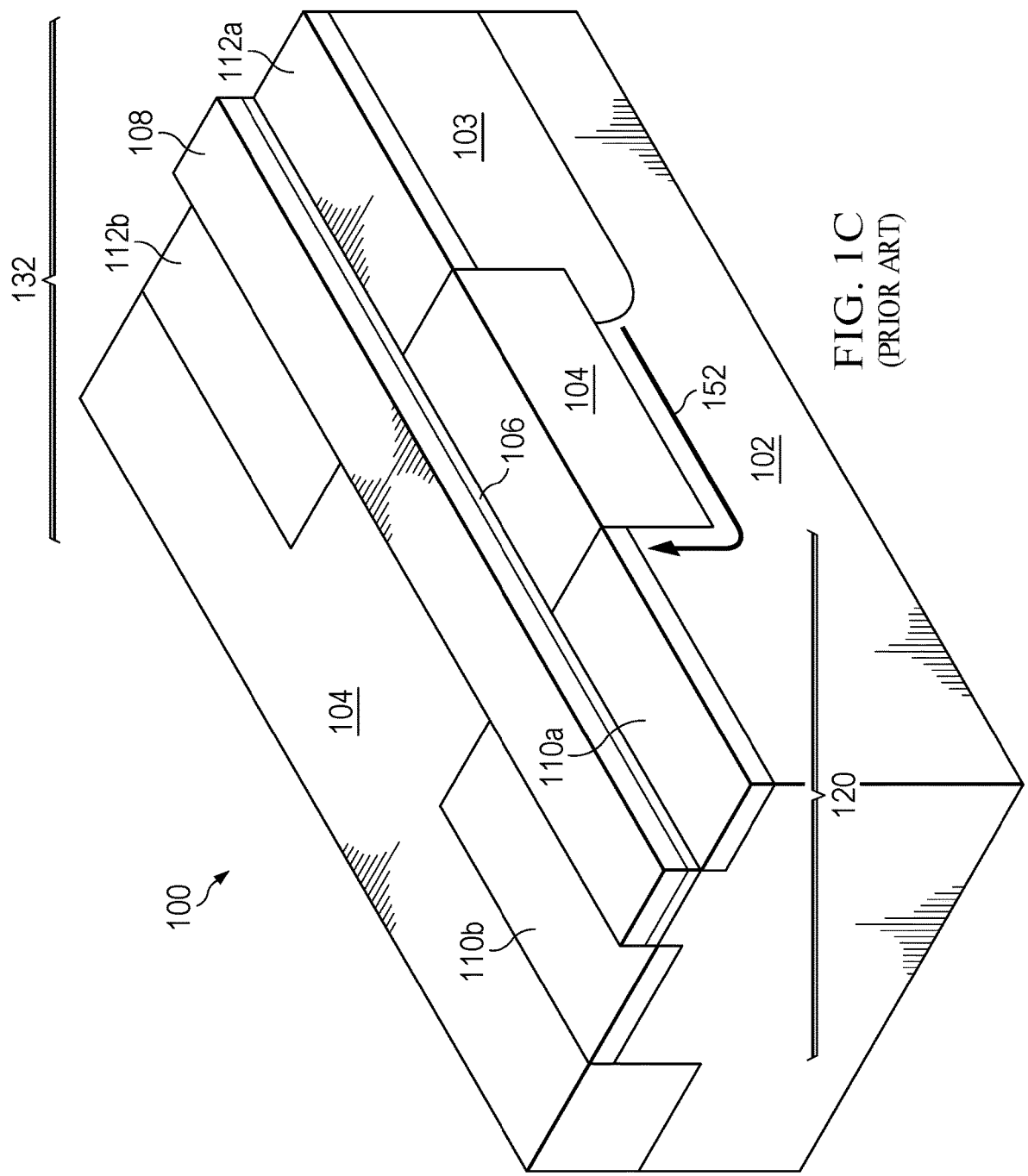
FIG. 1C is an isometric cross-sectional view of a portion of a prior art integrated circuit, showing a leakage current path due to a parasitic field transistor formed between an n-well and an NMOS transistor.

Referring now to FIG. 1C, another possible device-to-device (interdevice) field leakage path 152 is shown, illustrated in a similar portion of a prior art IC 100. This leakage path connects an n-well 103 and source 110a in NMOS transistor 120. An n-well 103 is typically formed as an isolation structure for PMOS transistors fabricated on a p-type silicon substrate 102. A PMOS transistor 132 is formed in n-well 103 with its own p+ diffusion regions 112a and 112b which may be a PMOS drain and source or vice versa. This transistor 132 is not necessary for the presence of the leakage path 152, but is illustrated as being typically associated with an n-well in a CMOS layout. Like leakage path 150 in FIG. 1B, leakage path 152 would best be illustrated running directly underneath gate 108. Leakage current in path 152 flows from n-well 103, which is typically biased to $V_{DD}$ for isolation, to a lower potential such as a source 110a in NMOS transistor 120. Again, field leakage current can be increased by making diffusions 110a and 110b both NMOS sources and biasing them to ground ($V_{SS}$).

As mentioned earlier, parasitic transistors are formed similarly in various field oxide isolation processes, such as LOCOS or STI. Gates running over thick field oxide can form parasitic field transistors in either isolation technology. STI field oxide is typically embedded into the substrate, whereas LOCOS oxide partially penetrates the substrate, and partially extends above the substrate surface. For STI, as just discussed, the parasitic edge transistors form under the gate just inside the active region along the FOX sidewall. An effective width $W_e$ of the associated parasitic edge transistors in STI depends on the width of an inversion region caused by charge buildup in the FOX due to TID, as well as on details of the fabrication process. In LOCOS, the fabrication process produces a tapered region called the "bird's beak" that is thinner towards the active region. Positive charge buildup in the bird's beak regions create the parasitic edge transistors in LOCOS. The extent or width of this bird's beak region also depends on the details of the fabrication process and contributes to the effective width $W_e$ of the associated parasitic edge transistors. Since the width $W_e$ of the inverted regions partly depends on the amount of charge buildup, and thus TID, the effective width $W_e$ is not entirely defined by the mask layout in either isolation process. But the length $L_e$ of the parasitic edge transistors in either LOCOS or STI transistors equals the gate length L of the drawn transistor.

Figure 2:
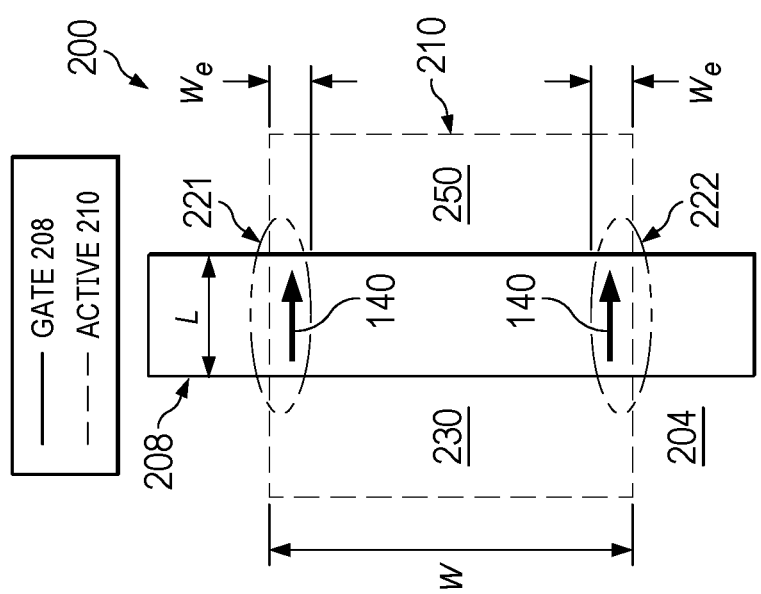
FIG. 2 is a schematic plan view or mask layout showing a prior art NMOS transistor.

A schematic plan view of an integrated circuit, or schematic mask layout view of a prior art NMOS transistor 200 is shown in FIG. 2. Although in modern IC technologies many mask layers may be required to fully define the boundaries of all the structures used in intermediate process steps such as deposition and etching of various material layers, only two mask layers are shown here and in some succeeding figures, in order to explain the basic features of the invention with simplicity and clarity. Other required masks, their patterns and associated intermediate process steps necessary to define some of the regions labeled within these mask layer outlines, although not described in detail herein, may be deduced by those skilled in the art. Thus FIG. 2 and succeeding figures in this disclosure may be interpreted either as illustrations of mask layouts or as simplified plan views of embodiments of the present invention as implemented in a MOS integrated circuit process.

For an NMOS transistor 200, a gate 208 (formed over a thin gate oxide layer, not shown) crosses an active region 210 surrounded by field oxide region 204, and serves in a self-aligned process to mask the region underneath gate 208 during n+ implantation of diffusion regions 230 and 250. (In this and future figures, a square geometry for the active region and uniform widths and lengths for gates are often chosen for ease of drawing comparisons. The top and bottom ends of gate 208 are shown cut off square in the layout, but may be connected to other devices in an integrated circuit.) As already stated, the labels and identities of diffusion regions 230 and 250, due to symmetry, are dictated by how they are connected within the IC and biased during operation, with drains connected to a higher potential like $V_{DD}$ than sources that may be connected to $V_{SS}$ (usually ground). For the purpose of explaining the present invention, regions labeled 230 are identified as NMOS drains, and regions labeled 250 are identified as NMOS sources that will be typically be connected to a lower potential or ground.

Transistor 200 has electrical characteristics such as current drive and speed that are largely determined by the width W of its active region, which is approximately the width of the channel formed under the gate 208 when transistor 200 is turned on to pass current, and the gate length L, and in particular the ratio W/L. In general, assuming drain 230 is held at $V_{DD}$ and source 250 is held at $V_{SS}$, increasing the W/L ratio results in a higher current for the same gate bias voltage $V_{GS}$. The same principles apply to parasitic edge transistors 221 and 222, which as discussed earlier are formed along the inside edges of the active region 210 boundary with field oxide 204, underneath where gate 208 crosses that boundary on the two edges as shown, as indicated by the elliptical outlines to highlight their approximate position and extent. (For brevity, the portions of the active region 210 boundary with field oxide 204 underneath crossings of gate 208 will be referred to herein as "edges.") Edge leakage paths 140 are shown from drain 230 to source 250 within edge regions of width $W_e$ that describe an effective width for the channels formed when edge transistors 221 and 222 start to get turned on by a gate bias voltage $V_{GS}$ that exceeds their threshold voltage $V_T$ such that leakage current begins to flow along leakage paths 140. Parasitic edge transistor width $W_e$ and the ease of inverting the parasitic edge channels are both affected by charge buildup in field oxide 204 under gate 208, which increases as a function of increasing TID, and thus leakage current increases with increasing TID. Parasitic edge transistor function is also affected by other parameters, such as doping concentrations and microscopic details of the fabricated geometry. In general, it is an objective of this invention to increase the sensitivity of these leakage currents to TID. It is a secondary objective to be able to tailor the functional response of the leakage currents to TID. This sensitivity or responsivity can be measured by characterizing leakage current as a function of exposure to (more accurately, to the dose of) ionizing radiation, or by similarly characterizing the shift of threshold voltage as a function of dose. Although the effective width $W_e$ of the parasitic edge transistors is not directly controlled by the mask layout, a minimum gate length L where gate pattern 208 crosses active 210 can be selected in order to maximize sensitivity (leakage current) of the edge transistors 221 and 222 by maximizing their effective W/L ratio.

Since the drain 230 and source 250 are the same for the as-drawn transistor 200 as for the parasitic edge transistors 221 and 222, and they share a common gate 208, they are connected electrically in parallel and their currents thus add. The transistors 200, 221, and 222 therefore act in parallel as if they were effectively a single "composite" transistor having a gate terminal, a drain terminal, and a source terminal, and I-V curves show a negative-shifted threshold voltage and higher leakage current at higher levels of TID. If the threshold-voltage shift of the parasitic edge transistors is large enough, it will cause an "OFF" state leakage current to flow at $V_{GS}=0$, and this leakage in the parallel parasitic transistors can effectively prevent the composite transistor from being completely turned off. For a given gate terminal potential, the leakage current increases with increasing TID, and thus measuring the leakage current enables such an NMOS transistor to act as a sensor for TID. Different bias conditions for the gate terminal, drain terminal, source terminal may be used at different times to facilitate separately-optimized dosing and measurement modes.

Figure 3:
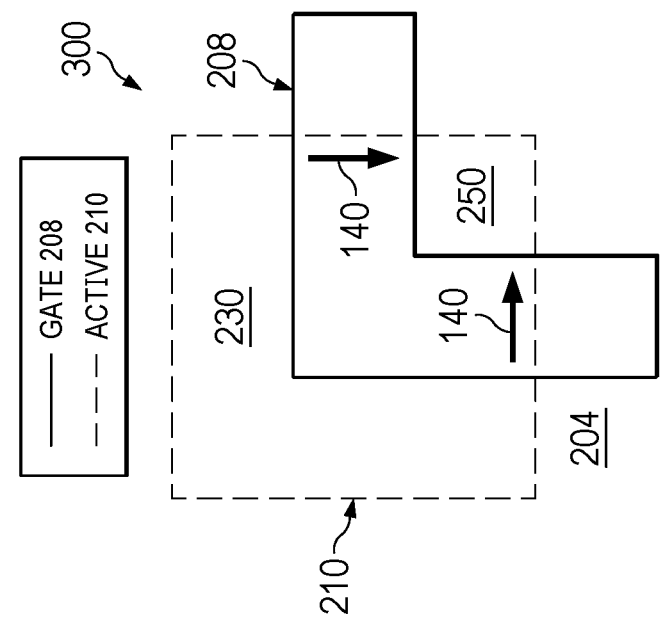
FIG. 3 is a schematic plan view or mask layout showing a corner sensor block having two edge leakage paths.

Now referring to FIG. 3, a mask layout is illustrated of a corner block MOS device 300 for sensing TID according to an embodiment of the present invention. Such a corner block may be used in the layout of arrays of sensors that will be described later. In this embodiment, gate 208 is L-shaped or bent at a right angle in the layout, but still crosses the boundary of active region 210 at two edges, and gate 208 divides active region 210 into two diffusion regions 230 and 250. With one portion of active region 210 used as a drain 230, and another used as source 250, there are two parasitic edge transistors, similar to those in FIG. 2, but having their leakage currents 140 directed as shown. By swapping the positions of drain 230 and source 250, the directions of leakage currents 140 can be reversed if desired. Again, to maximize sensitivity, a gate length, as determined by the width of the gate pattern 208 where it crosses the boundary of active region 210, may be chosen to be a minimum dimension (as allowed by the IC process layout design rules) at each such crossing. The two crossings need not be the same width, and some gate patterns that can enhance overall performance will be described in which a wider gate pattern may increase the sensitivity of an associated parasitic field transistor. Likewise, the gate pattern is not required to turn at a right angle as shown, but could be any angle, or curved, and the active region can be any shape. Typical IC layouts are done in a rectangular "Manhattan" layout, and maximizing sensitivity per unit circuit area by using minimum design rules may often lead to patterns resembling those in the exemplary embodiments shown herein. Again, the ends of the L-shaped gate pattern 208 in FIG. 3 are each shown as extending a nominal "unit" distance toward the bottom and the right of the figure, and truncated with square ends, but this is only for purposes of illustration, and these extents and shapes are not required for the function of the invention, nor should they be interpreted as limiting the spacing such blocks can take when interconnected with other parts of a layout according to the present invention. Also, it will be understood to those skilled in the art that any of the layouts illustrated herein may be rotated, reflected, or inverted in any orientation in an IC layout without affecting the function of the invention. Field oxide region 204 is labeled in FIG. 3 to indicate that it surrounds active 210, but in subsequent figures the field oxide will remain unlabeled in order to minimize drawing clutter, and field oxide 204 will be understood to exist outside and surround all enclosed boundaries of active 210.

Figure 4B:
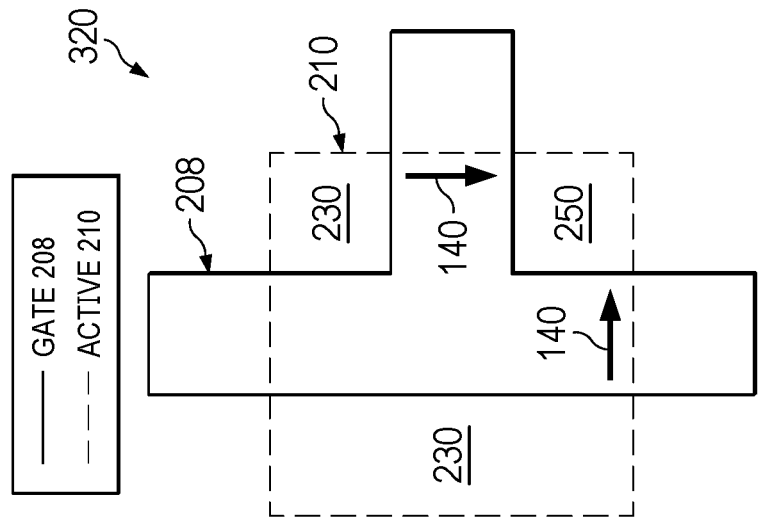
FIG. 4B is a schematic plan view or mask layout showing a sensor block with a T-shaped gate having two different edge leakage paths from those in FIG. 4A.
Figure 4A:
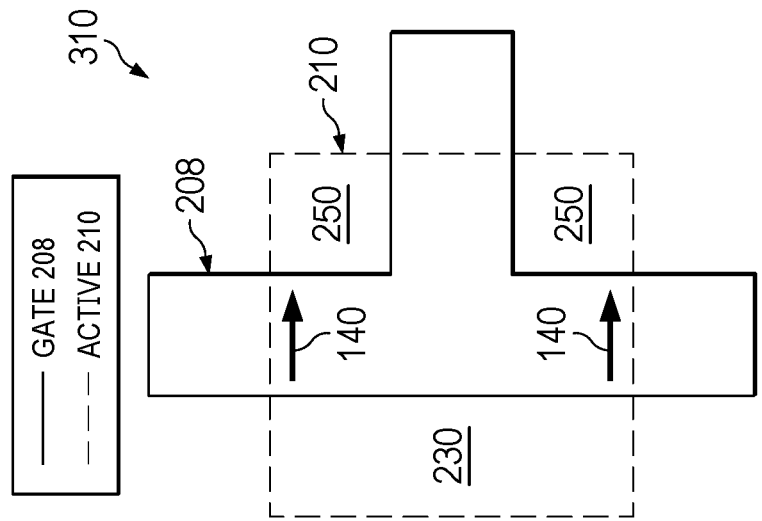
FIG. 4A is a schematic plan view or mask layout showing a sensor block with a T-shaped gate having two edge leakage paths.

In FIGS. 4A and 4B, mask layouts are shown for two variations of a T-shaped sensor block according to embodiments of the present invention. In both of these embodiments, gate 208 branches within the active region 210 such that it crosses the boundary of active 210 in three places. In FIG. 4A, a first version of a T-shaped sensor 310 is shown in which there is one drain 230 on one side of the "crossbar" (shown as vertical in the drawing), and there are two sources 250 on either side of the "stem" (shown as extending horizontally to the right). Sensor 310 has parasitic edge leakage current paths 140 as shown, flowing from drain to source across the two arms of the crossbar. In FIG. 4B, an alternative version of a T-shaped sensor 320 is shown, which differs from that of FIG. 4A only in that there are two drain regions 230 and one source region 250, with a drain 230 and source 250 on either side of the stem of the "T." The two edge leakage currents flow under the stem and one side of the crossbar, instead of across the two arms of the crossbar. In both sensors 310 and 320, the three-branched gate 208 divides active 210 into three diffusion regions that can be either drains 230 or sources 250, and there are two possible edge leakage paths 140. It can be proven that the maximum number of edge leakage paths 140 in a layout having an odd number N of edges is equal to (N−1). Therefore, it is not possible to have more than two edge leakage paths 140 in sensors having three branches of gate 208 crossing the boundary of active 210, like those in sensors 310 and 320.

In either of these alternative embodiments of sensor 310 or sensor 320, the drains 230 can be interchanged with sources 250 in order to reverse the physical direction of the edge leakage paths 140. However, such physical direction reversal will not reverse the sign of current flow from positive to negative, because current always flows from a drain to a source along each edge. Likewise, the magnitude of the edge leakage currents is determined mostly by the gate length along the active boundary 210 where it crosses, and thus reversal will negligibly affect the magnitude of leakage current, and hence, the sensitivity of the sensor to TID. In order to maximize sensitivity (and magnitude) of the leakage current to TID, the gate length at each crossing may be minimized, as discussed above. In these embodiments, there is one crossing (between two drains or two sources) that does not contribute to the edge leakage current, and therefore the width of the gate pattern crossing that edge may be widened without reducing the contributions of the two edge leakage paths 140. Embodiments to be described later make use of this fact to increase the contribution of field leakage paths.

Figure 5:
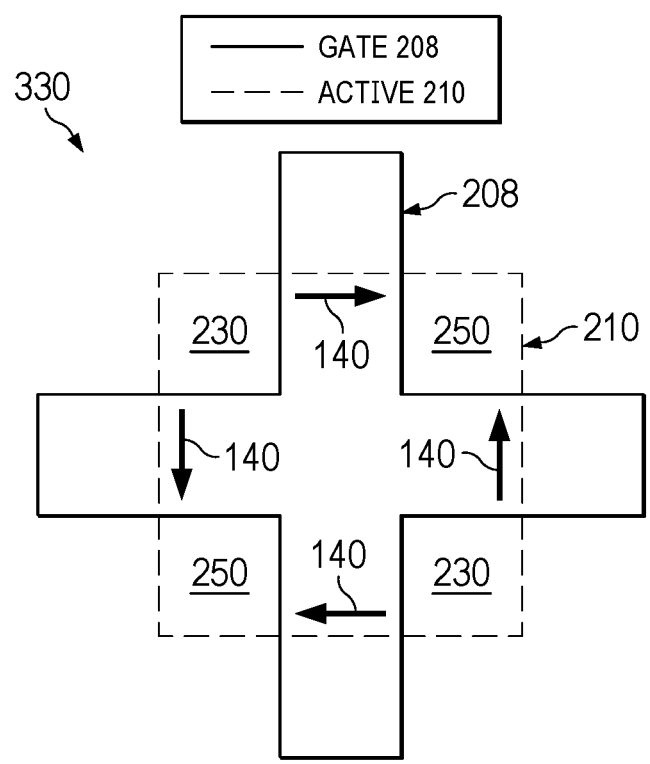
FIG. 5 is a schematic plan view or mask layout showing a sensor block with a cross-shaped gate having alternating drains and sources and four edge leakage paths.

Referring now to FIG. 5, a mask layout of a TID sensor 330 having a cross-shaped gate 208 crossing the boundary of active region 210 at four places ("edges") is illustrated. A different shape for gate 208 could be chosen other than a cross, but by using minimum design rules, this layout can be efficient in minimizing circuit area, i.e., in achieving maximum sensitivity to TID in a given area. Gate 208, having four crossings as shown, divides active region 210 into four diffusion regions 230 and 250. By alternating drains 230 and sources 250 between the gate "arms" (branches) around the boundary, it can be seen that four edge leakage paths 140 directed as shown can be achieved in this layout. As discussed above, the drains 230 and sources 250 may be interchanged (as long as they remain alternating) while still retaining the same number of leakage paths, and hence, the same sensitivity to TID. If drains 230 and sources 250 were interchanged, the physical directions of leakage currents along the surface of the IC would change, but their magnitude and electrical sign would remain the same. The maximum number of edge leakage paths 140 in a layout having an even number N of edges is equal to N, achieved when drains 230 and sources 250 are alternated strictly around the boundary of active 210. Thus, four is the maximum number of edge leakage paths 140 in this layout having four edges defined by gate crossings. Again, maximum sensitivity is achieved by minimizing the width of the gate pattern 208 where it crosses the boundary of active 210 (i.e., by minimizing the effective gate lengths $L_e$ of the parasitic edge transistors), but otherwise there is no requirement that all four arms of gate 208 be the same width or shape.

Figure 6B:
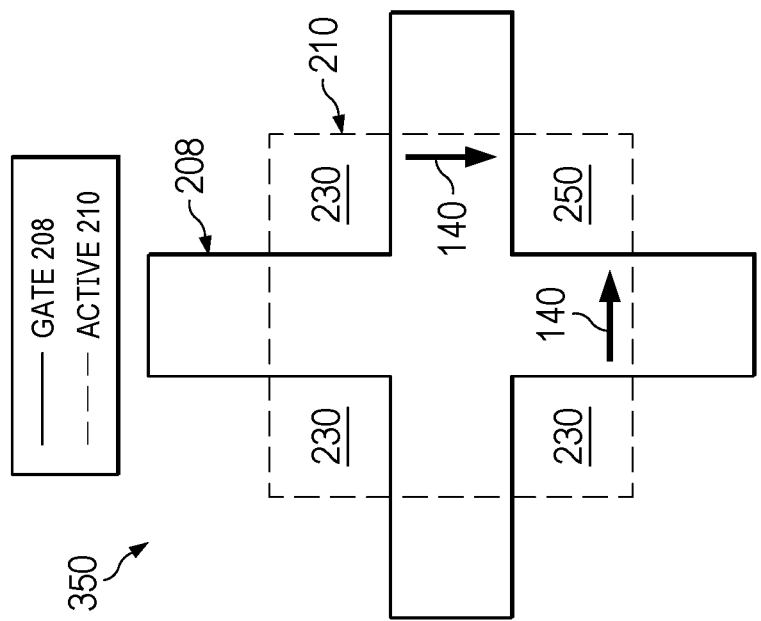
FIG. 6B is a schematic plan view or mask layout showing a sensor block with a cross-shaped gate having two different edge leakage paths from those in FIG. 6A.
Figure 6A:
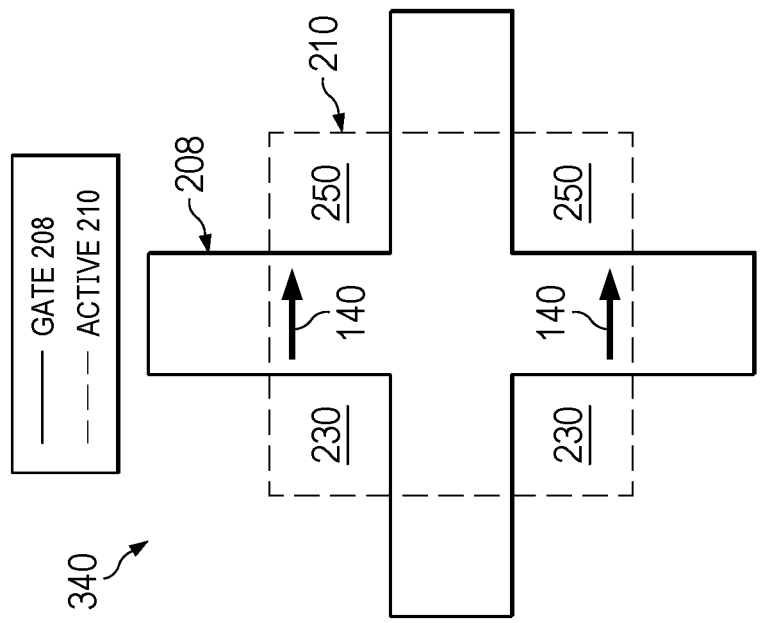
FIG. 6A is a schematic plan view or mask layout showing a sensor block with a cross-shaped gate having paired drains and sources and two edge leakage paths.

Mask layouts for two variations of TID sensors are now shown in FIGS. 6A and 6B. Like FIG. 5, these embodiments have four branches of gate 208 crossing over the boundary of active 210, but each employs a different distribution of drains 230 and sources 250. In FIG. 6A, a sensor 340 is shown in which there are two drains 230 and two sources 250, but instead of alternating around the boundary, they are placed in pairs, with two drains 230 to the left, and two sources 250 to the right of the layout. This configuration results in two edge leakage paths 140 directed as shown along the top and bottom edges, and no edge leakage paths between drains 230 or sources 250 on the left and right edges. In FIG. 6B, a sensor 350 is shown also with four diffusion regions, but having three drains 230 and one source 250 instead of two of each. In sensor 350, as in sensor 340, two edge leakage paths 140 are achieved, but on adjacent arms of gate 208 in sensor 350 instead of opposite arms as in sensor 340. This configuration of sensor 350 might be useful in certain array layouts that use field leakage transistors. There is no configuration of drains 230 and sources 250 that results in an odd number of edge leakage paths 140; and the same number of edge leakage paths 140 would result if drains 230 were interchanged with sources 250.

Figure 7A:
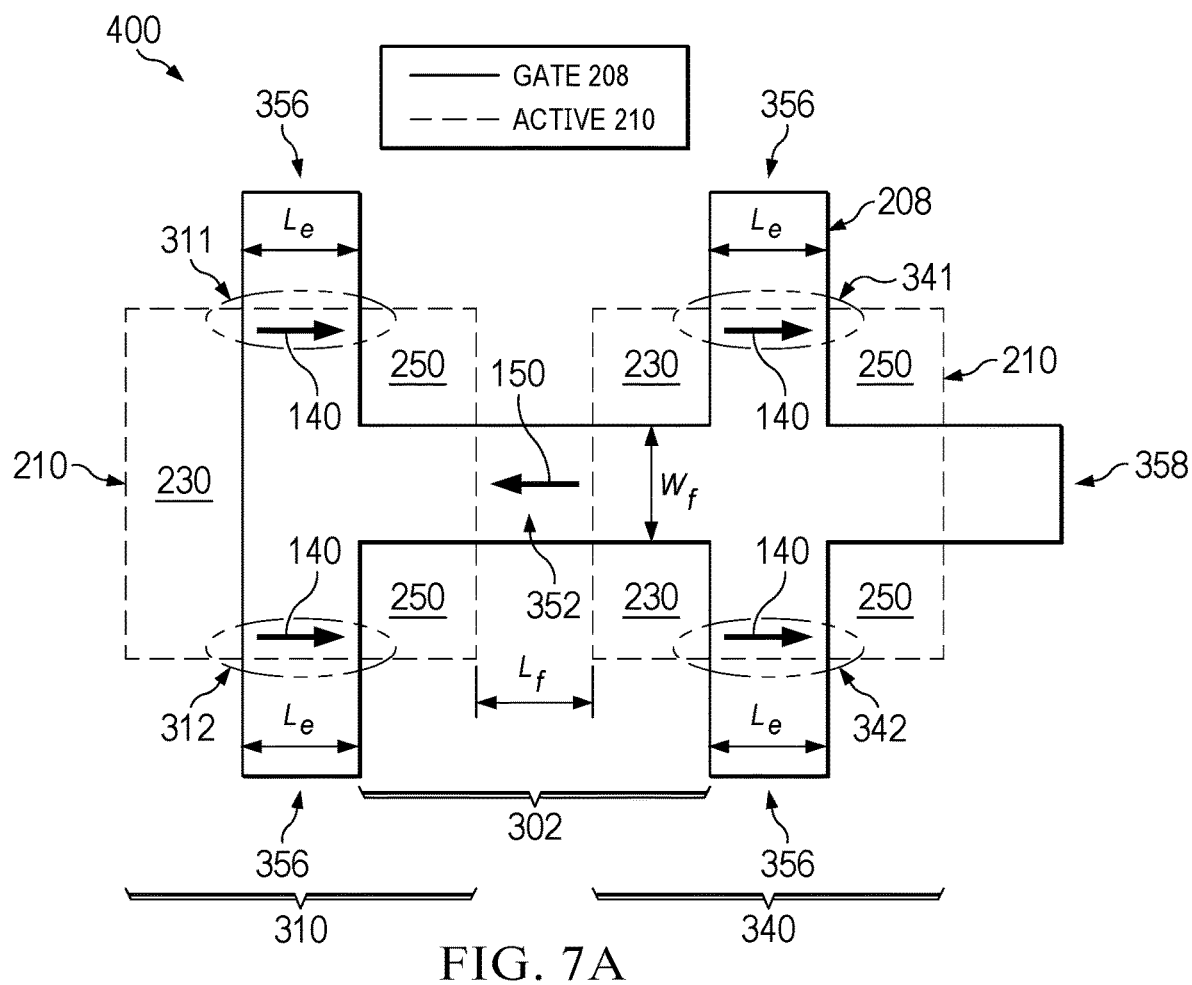
FIG. 7A is a schematic plan view or mask layout showing a TID sensor having edge leakage paths and a field leakage path between active regions.

Referring now to FIG. 7A, a mask layout of an NMOS TID sensor 400 having both edge and field parasitic transistors is shown. In this exemplary embodiment, T-shaped sensor of type 310 on the left of the drawing is connected to cross-shaped sensor of type 340 on the right-hand side through a portion 352 of gate 208 that crosses the field oxide between the two sensors 310 and 340. Four parasitic edge leakage paths 140 occur as shown along the top and bottom arms of gate 208 in both sensors 310 and 340. These edge leakage paths 140 occur in parasitic edge transistors 311 (top edge of 310), 312 (bottom edge of 310), 341 (top edge of 340), and 342 (bottom edge of 340), in analogy with edge transistors 221 and 222 shown in FIG. 2, having effective gate widths $W_e$ (not shown) determined by charge buildup and inversion layer widths as discussed previously, as well as gate lengths $L_e$ determined by the widths of the gate pattern 208 where it crosses the respective active region 210 boundaries (as shown). In addition, charge buildup due to TID in a parasitic field transistor 302 formed between a pair of drains 230 (shown on the left side of sensor 340) and a pair of sources 250 (shown on the right side of sensor 310) results in a field leakage path 150 as shown under the field oxide under gate segment 352, which adds its leakage current to those of parasitic edge transistors 311, 312, 341, and 342. The effective gate width of the parasitic field transistor is $W_f$, which is the width of gate segment 352, and the effective gate length of the parasitic field transistor is $L_f$ as shown, as determined by the spacing between active regions 210 in sensor 310 and sensor 340. All of the widths of gate 208 are shown here to be the same, for convenience in schematically drawing the figures (and to minimize layout size), but this need not be the case. In particular, the magnitude of leakage current in field leakage path 150 can be increased by increasing the width $W_f$ of gate 208 in segment 352, at the expense of increasing device size; as discussed previously, edge leakage currents are maximized by minimizing the width of gate segments along edges so as to minimize parasitic edge transistor gate lengths $L_e$. The directions of leakage currents can be changed, as described above, by interchanging drains 230 and sources 250 with little effect on the sensitivity of TID sensor 400.

Figure 7B:
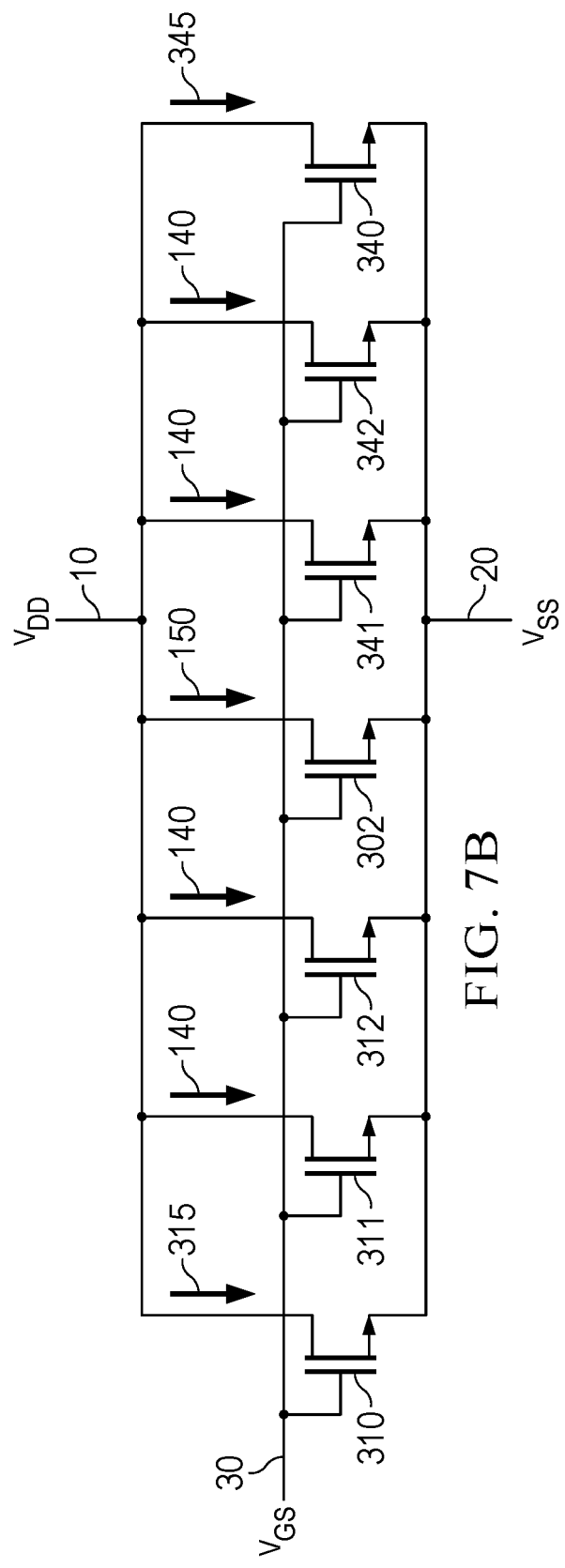
FIG. 7B is a schematic circuit diagram of gate oxide and parasitic transistors corresponding to the layout of FIG. 7A.

In FIG. 7B, a schematic circuit diagram is shown illustrating how the as-drawn gate oxide transistors in FIG. 7A act in parallel with the parasitic NMOS transistors of both field and edge types such that their total drain leakage currents sum during operation of sensor 400. Sensors 310 and 340 have leakage currents 315 and 345, respectively, associated with their as-drawn gate oxide transistors indicated in schematic FIG. 7B by NMOS transistor sensors 310 and 340. Edge leakage current paths are indicated by 140 corresponding to parasitic edge transistors 311, 312, 341, and 342, and field leakage path 150 is schematically shown flowing in the drain of parasitic field transistor 302. In order for all these currents to sum, all drains are connected together in a layout (these connections are not shown in most of the figures herein to avoid clutter, and may use contacts and a metal layer) to a common drain terminal 10, which is typically biased at a potential $V_{DD}$ during measurement of leakage current. All sources are connected together in the layout (also not shown) to a common source terminal 20 typically connected to $V_{SS}$, and all gates may be connected by use of a common gate pattern 208 to a common gate terminal 30 at gate potential $V_{GS}$. (In some embodiments, discontinuities in the gate pattern may occur, in which the gates can be connected together using a separate conductor, e.g., metal on a different layer and appropriate contacts and vias.) Gate potential $V_{GS}$ applied to gate 208 can be held at $V_{SS}$ during measurement of leakage current, and/or biased differently during exposure to increase response to TID.

Sensors 400 can be combined in parallel into linear or 2-dimensional arrays such that their currents sum to increase sensitivity to TID. The layout in the embodiment shown in FIG. 7A facilitates this by having the gate 208 possess ends 356 in the vertical direction and end 358 on the right for horizontal connection to other sensors. (The length of the gate extensions ending in 356 and 358 is limited only by design rules, and could be shorter or longer than shown here.) These connections can be used to add sensors with more parasitic transistors, of either edge or field type. For example, a vertical linear array can be implemented by tiling sensors 400 to connect their gate ends 356 together in a layout; a horizontal linear array can be formed by tiling additional sensors 340 to the right (as will be seen later in the examples in FIGS. 9B and 10B); and two-dimensional arrays can be formed using both of these layout techniques.

As will be seen in further embodiments to be described later, the number of parasitic edge transistors and parasitic field transistors can be traded off in a layout by adjusting the number and position of drains and sources, such that desired sensitivity and response to TID can be tailored in a device that combines both types of parasitic transistors.

In another embodiment, an even simpler and smaller TID sensor (not shown) than that of FIG. 7A, also having both types of parasitic transistors, edge and field, can be formed using, for example, a sensor having three gate branches such as T-shaped sensor 310 and a parasitic field transistor formed between one of the three gate branches that emerges from sensor 210 between two sources 250, and crosses over FOX 204 and onto an active region 210 having a pair of drains 230 on either side of the gate 208. This can be a smaller device, albeit having fewer (only two) edge leakage paths 140 since none occurs in the active region 210 that has only a pair of drains 230. Again, the direction of field leakage current path 150 can be reversed by appropriately changing whether the diffusion regions on either end of this path are drains 230 or sources 250.

Figure 8A:
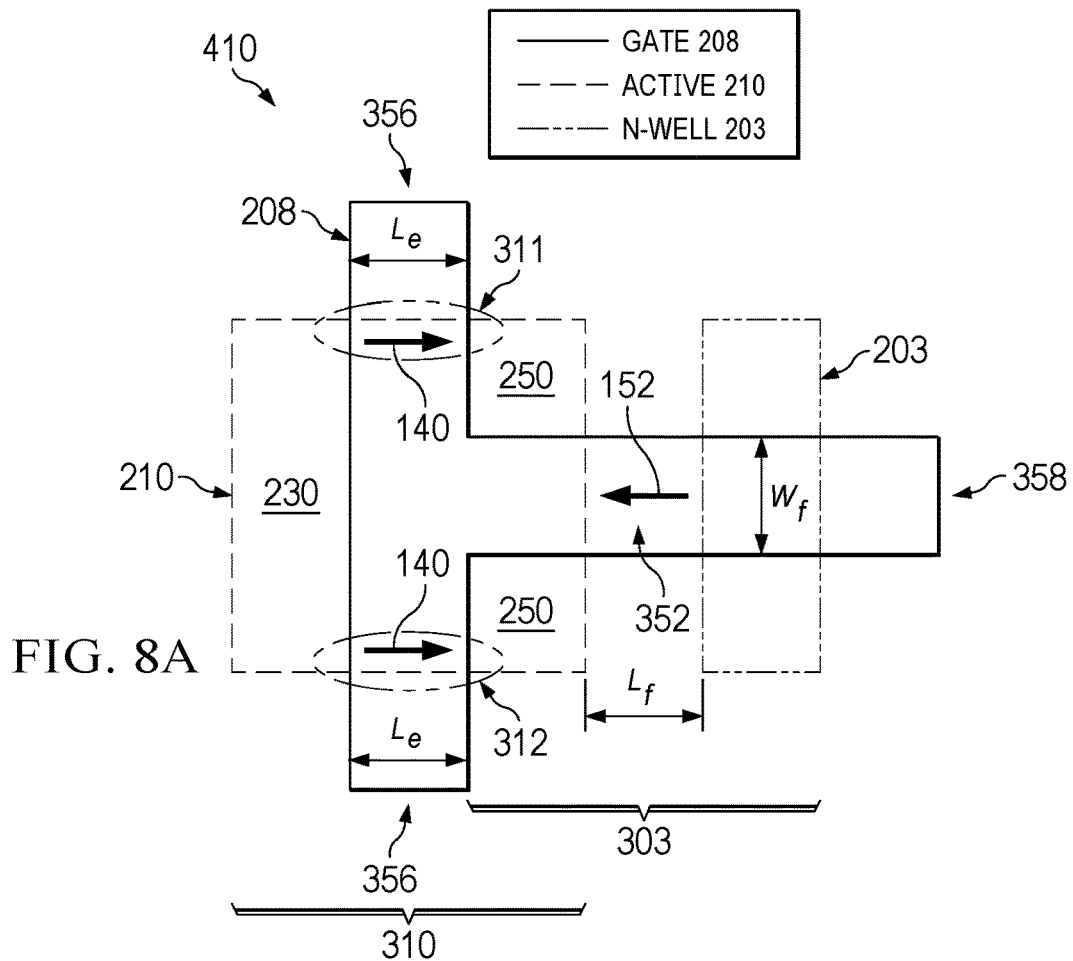
FIG. 8A is a schematic plan view or mask layout showing a TID sensor having edge leakage paths and a field leakage path between an n-well and an active region.

Referring now to the mask layout illustrated in FIG. 8A, a sensor 410 is shown that makes use of a parasitic field transistor 303 under gate segment 352 between an n-well region 203 and sources 250. This parasitic field transistor 303 functions using a leakage path 152 like that previously described in reference to FIG. 1C, having effective gate width $W_f$ and gate length $L_f$ as shown. The n-well region 203 can be a minimum size dictated by process design rules, and need not surround a neighboring transistor or other device, although in some designs an efficient layout might combine the sensor 410 with other circuitry. Again, gate ends 356 in the vertical direction and 358 on the right can facilitate tiling of these sensor devices 410 into a larger array of parallel-connected sensors. But if sensor 410 is not tiled in an array, gate 208 needs not extend more than a minimum amount allowed by design rules past active region 210 to ends 356 in order to form parasitic edge transistors 311 and 312, and also needs not extend all the way across n-well region 203 to form parasitic field transistor 303. In some embodiments, both n-wells 203 and diffusion regions 230 and/or 250 may be used within the same sensor as drains or sources for parasitic field transistors, in addition to the parasitic edge transistors associated with at least one active region 210.

In some embodiments, a field gate comprising a conductive layer over gate segment 352 between sensor 310 (or similar first active region) and a second region that is either a second active region 210 or an n-well 203 can be formed in a metal layer, instead of the same layer 208 as polysilicon gates.

Figure 8B:
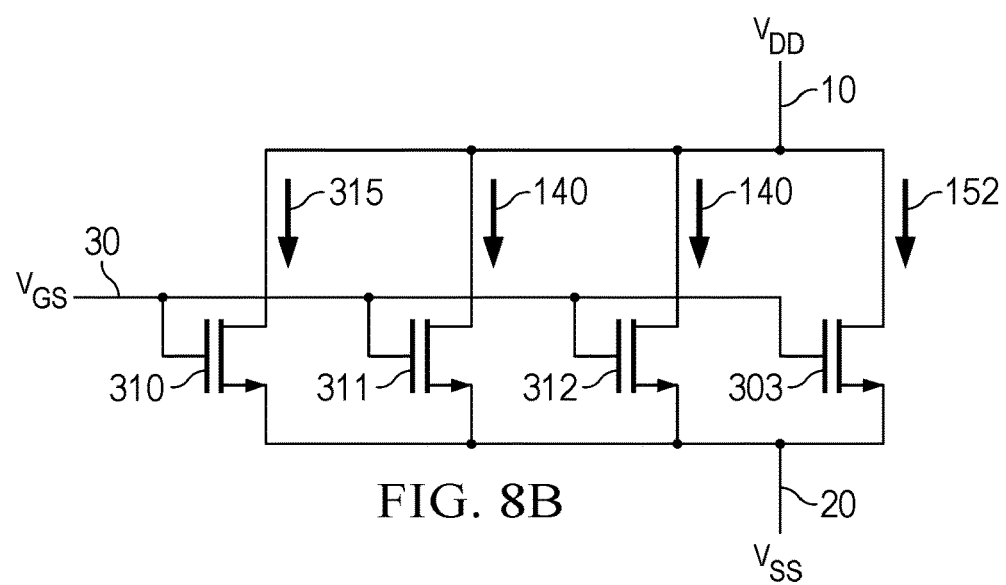
FIG. 8B is a schematic circuit diagram of gate oxide and parasitic transistors corresponding to the layout of FIG. 8A

FIG. 8B is a schematic circuit diagram showing the effective operation in parallel of the gate oxide transistor of sensor 310 having leakage current 315, parasitic edge transistors 311 and 312 each with leakage current 140, and parasitic n-well to source field transistor 303 having leakage current 152. These are all connected in parallel in an overall layout as described above, with drains 230 connected together and to common drain terminal 10, sources 250 connected together and to common source terminal 20, and gates 208 connected together to common gate terminal 30.

A number of exemplary embodiments will now be described showing how simple sensor building blocks described previously can be combined in arrays in different ways to implement composite sensors having different contributions from parasitic edge and field transistors. The magnitude (hence sensitivity to TID) as well as the shape of the functional response of leakage current to TID can be tailored by using these different combinations.

Figure 9A:
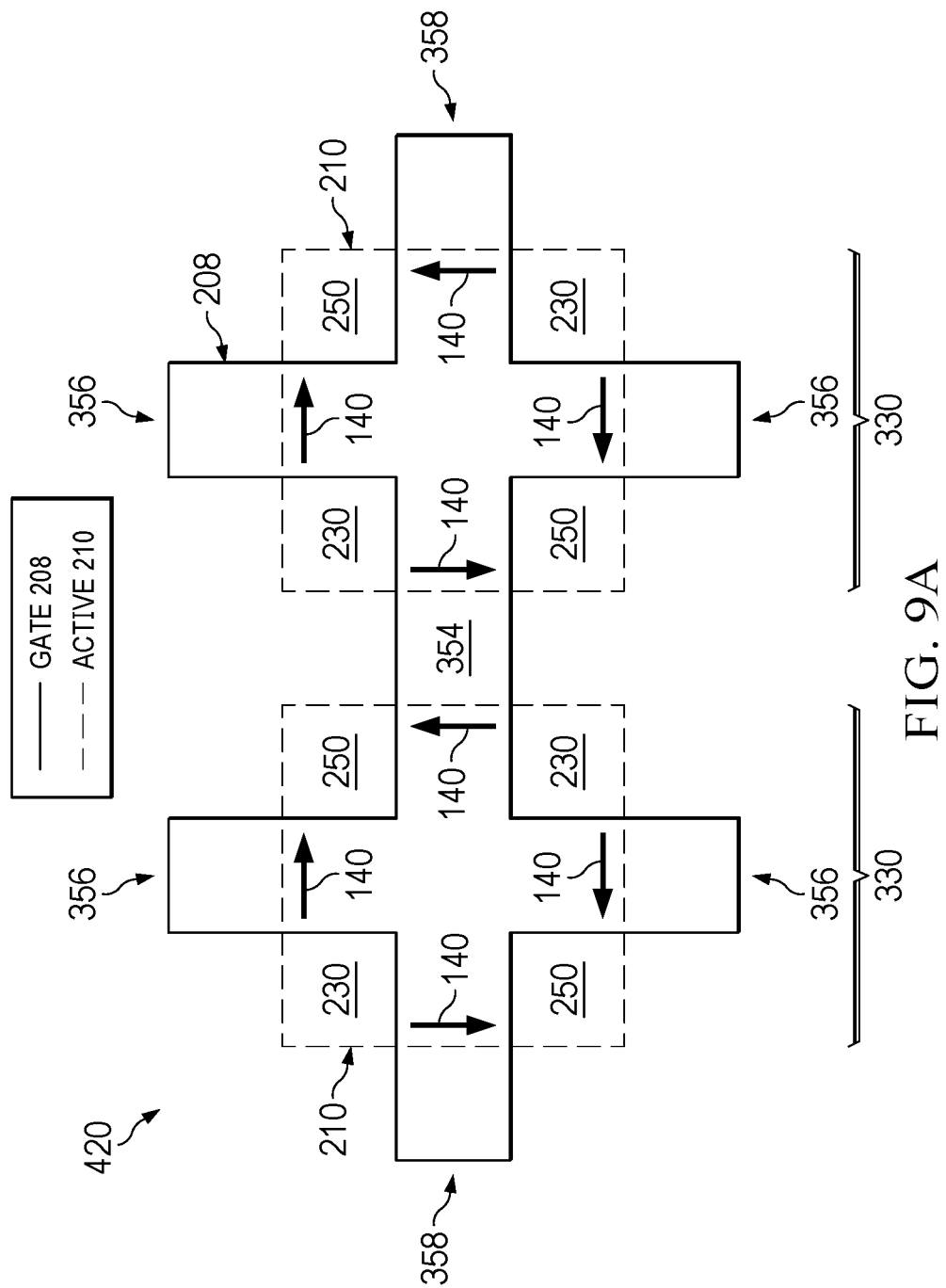
FIG. 9A is a schematic plan view or mask layout showing two sensor blocks as in FIG. 5 coupled by abutting gate patterns.

Referring now to FIG. 9A, a mask layout shows a combined sensor 420 comprising two cross-shaped sensors of type 330 connected together by a common gate segment 354 across the field oxide between them. These cross-shaped sensors 330 have four edge leakage paths 140 each. This maximizes the number edge leakage paths 140 in the combination, but does not provide a parasitic field transistor, since having both a drain 250 and a source 230 on each end of segment 354 tends to cancel currents under it. But a high density of edge leakage paths 140 can be incorporated into linear or two-dimensional rectangular arrays by laying units 420 next to each other and touching gate ends 356 in the vertical direction and/or gate ends 358 in the horizontal direction.

Figure 9B:
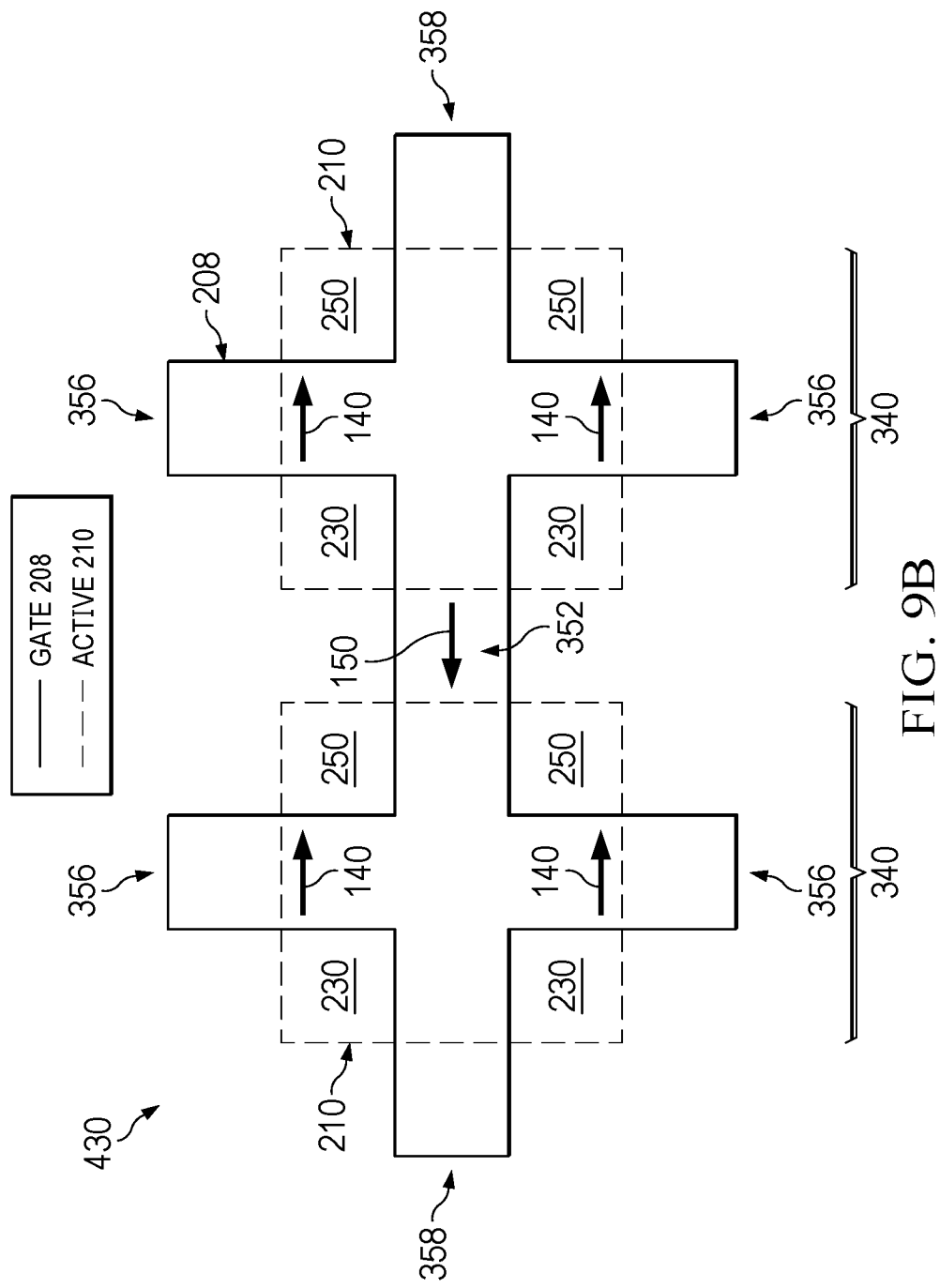
FIG. 9B is a schematic plan view or mask layout showing two sensor blocks as in FIG. 6A coupled by abutting gate patterns.

FIG. 9B shows a mask layout of a sensor 430 combining two cross-shaped sensors of type 340 side-by-side. This arrangement has a total of four edge leakage paths 140, two for each sensor 340, plus a field leakage path 150 under gate segment 352 between the two sensors 340. Again, these sensors could be extended into linear or two-dimensional arrays using gate ends 358 to add more sensor 340 units horizontally, and/or vertically using gate ends 356.

Figure 10A:
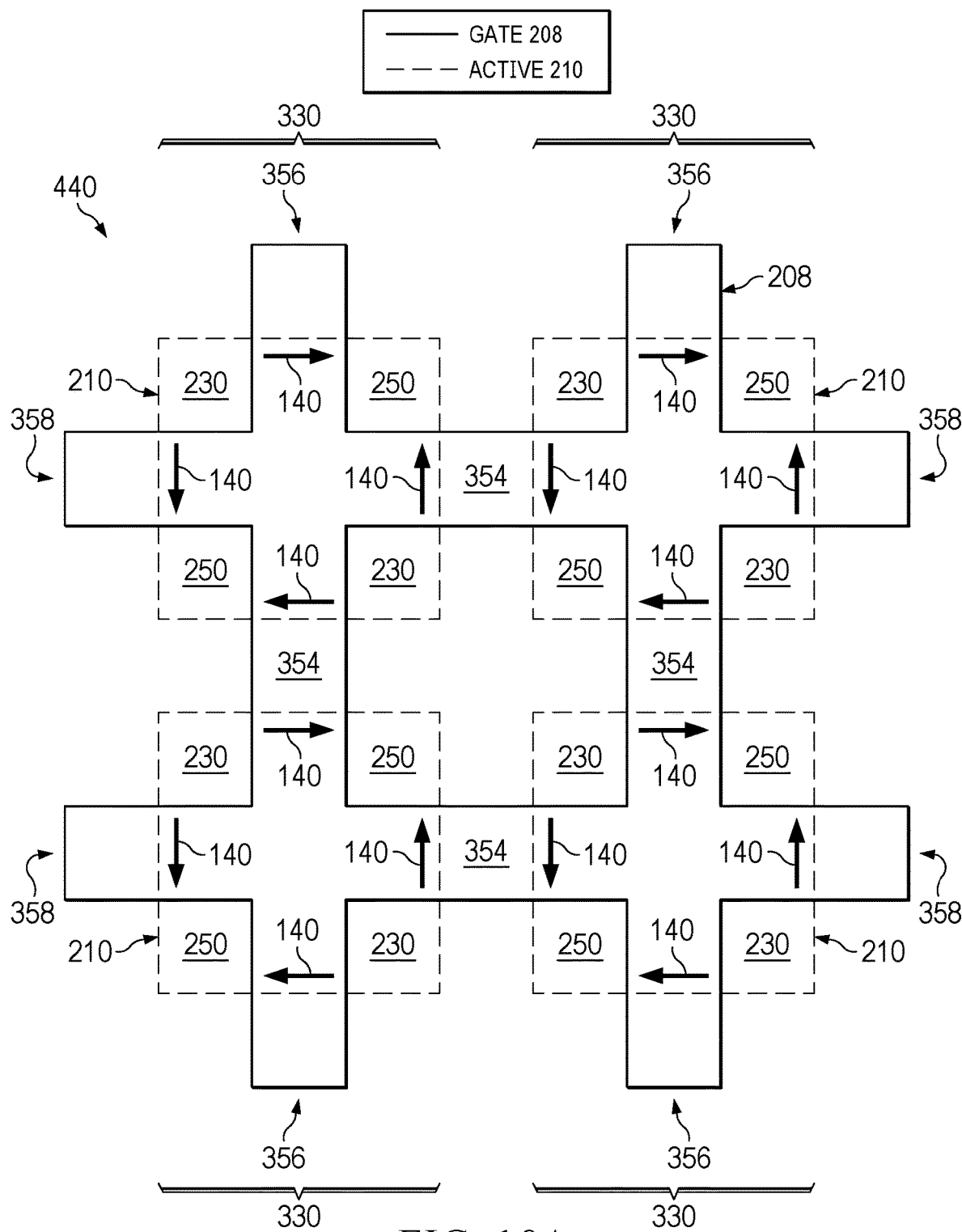
FIG. 10A is a schematic plan view or mask layout showing four sensor blocks as in FIG. 5 coupled in a two-dimensional array by abutting gate patterns.

As an example of a two-dimensional array, in FIG. 10A a mask layout is shown of an array 440 comprising four sensor units 330 interconnected by a common gate structure 208 both horizontally and vertically. Using type 330 units only provides a maximum number of edge leakage paths (four per unit) of 16 in this example 2×2 array, but no field leakage paths in gate interconnecting segments 354.

Figure 10B:
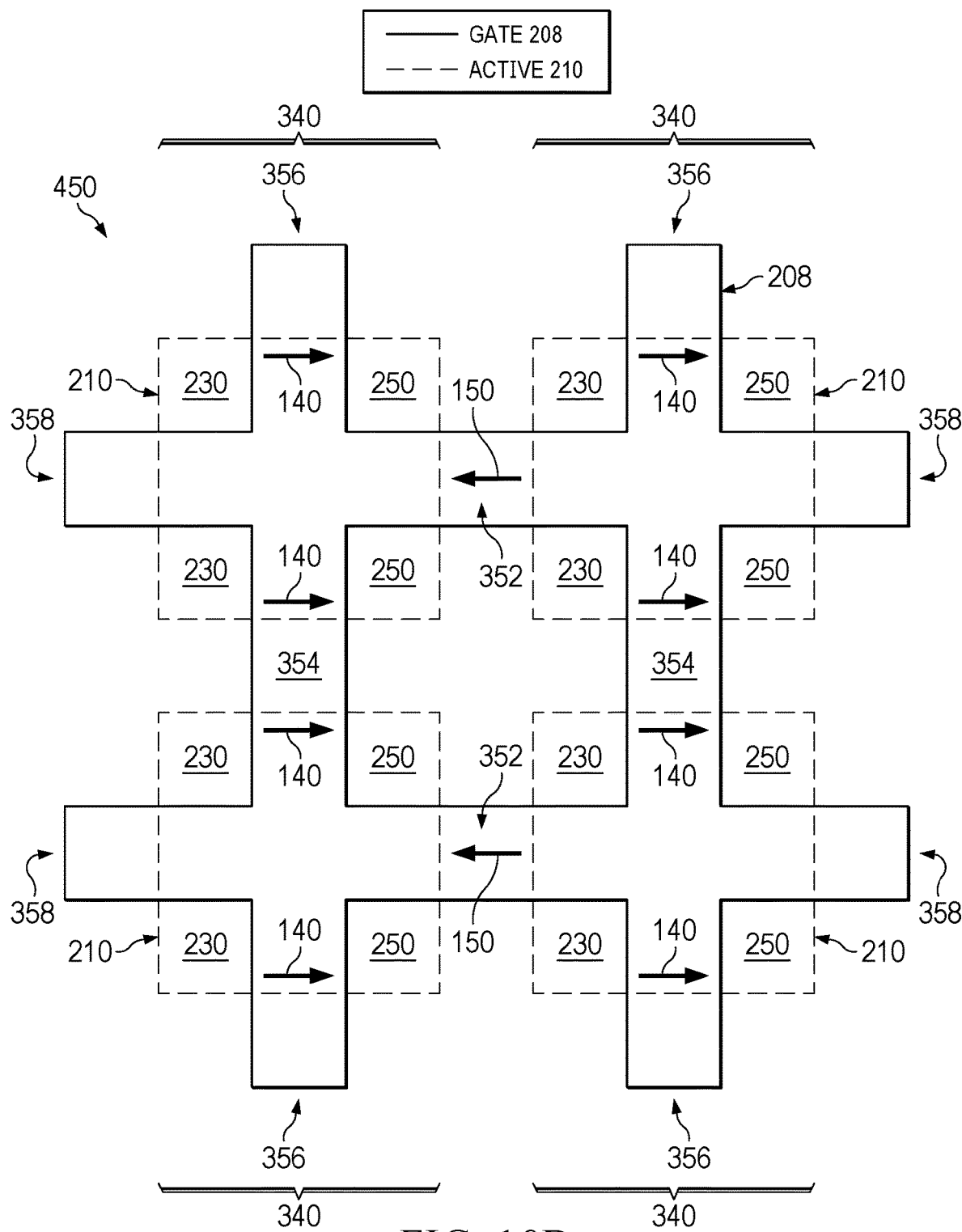
FIG. 10B is a schematic plan view or mask layout showing four sensor blocks as in FIG. 6A coupled in a two-dimensional array by abutting gate patterns.

In FIG. 10B, a mask layout shows an array 450 consisting of four sensor units 340. Using these sensor units in the orientations shown provides eight edge leakage paths 140 as well as two field leakage paths 150 under horizontal gate segments 352, whereas there are no field leakage paths under vertical interconnect segments 354. It can now be seen that mixing different "building block" units of the types described above can be used to achieve a desired mix of edge leakage paths and field leakage paths.

Figure 11:
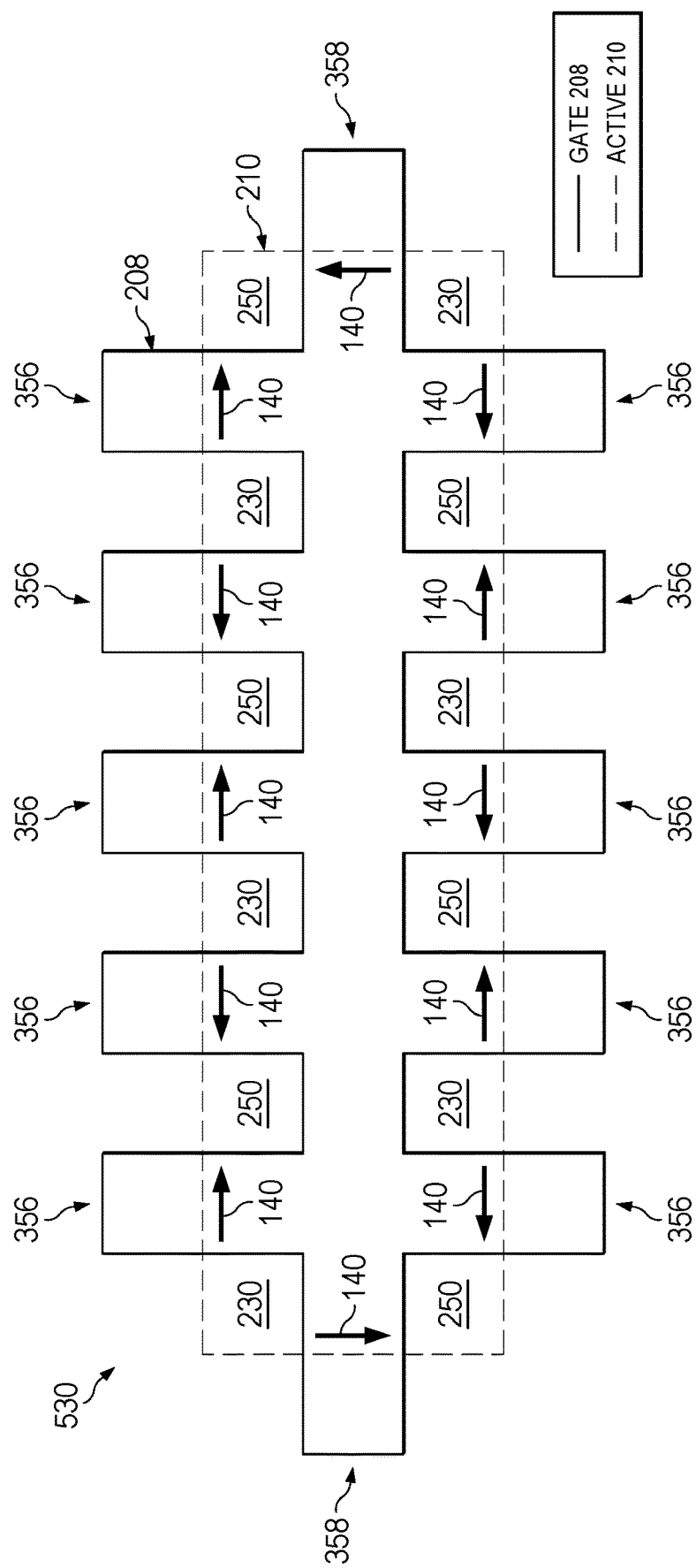
FIG. 11 is a schematic plan view or mask layout showing a sensor block having twelve edge leakage paths.

Referring now to FIG. 11, a mask layout is shown of an exemplary embodiment of a sensor 530 having more than four gate branches crossing the boundary of active region 210. In this example, twelve (12) branches of gate 208 cross the boundary of active region 210, creating 12 edges and 12 diffusion regions. The diffusion regions comprise six drains 230 and six sources 250 strictly alternating between the gate branches along the boundary so as to maximize the number of parasitic edge transistors, each providing a leakage path 140, for a total of 12 edge leakage paths 140. While strict alternation of drains 230 and sources 250 achieves the maximum of N edge paths for N gate branches, if this unit 530 were to be tiled either vertically using gate ends 356 or horizontally using gate ends 358, no parasitic field leakage paths would be formed.

Figure 12:
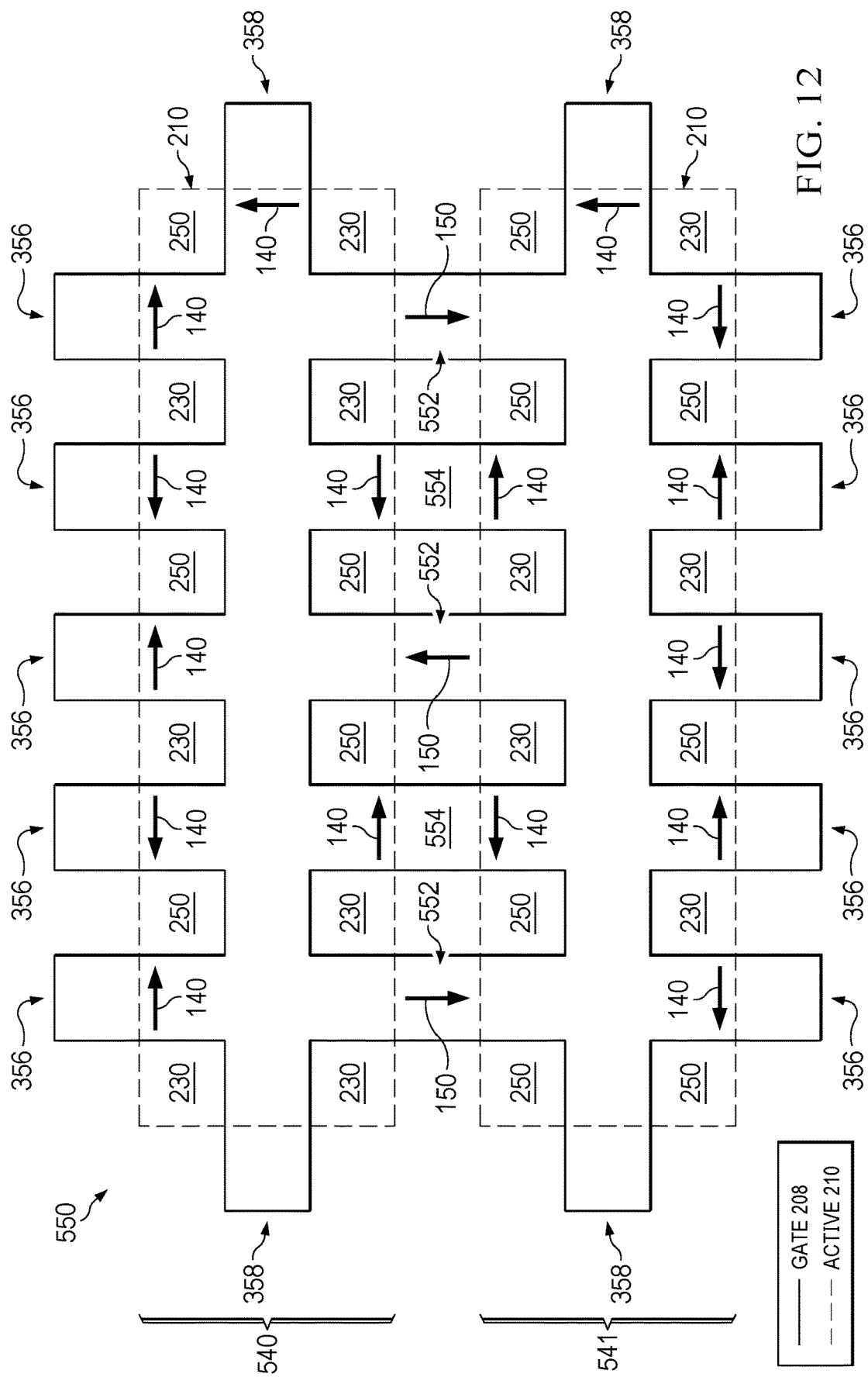
FIG. 12 is a schematic plan view or mask layout showing two abutting sensor blocks having different arrangements of drains and sources such that there are both edge leakage paths and a field leakage paths.

In FIG. 12, a layout is shown of a composite sensor 550 incorporating two 12-branch units 540 and 541, each modified from sensor 530, to create a structure that permits field leakage paths 150 as well as edge leakage paths 140. The sensors 540 and 541 differ from sensor 530 of FIG. 11 only in their arrangement of drains 230 and sources 250. Drains 230 and sources 250 are alternated around the outer perimeter of the composite sensor 550 in order to maximize the edge leakage paths 140 there. Drains 230 and sources 250 are paired along the edges of sensor units 540 and 541 that face each other along the center of the drawing so as to create three field leakage paths 150 in the gate "bridges" 552 that connect the two sensor units 540 and 541. Gate bridges 554 are segments between units 540 and 541 that do not give field leakage paths 150, but instead, because they are flanked by one drain 230 and one source 250 on each end, have edge leakage paths 140 along the boundaries of active region 210 in each unit 540 and 541. With the number of branches shown, it can be seen that instead of strictly alternating all the way around each active region 210, there are two drains 230 paired at the left end of unit 540 on either side of horizontal gate end 358, and two sources 250 paired at the left end of unit 541 on either side of horizontal gate end 358, such that there are no edge leakage paths under gate ends 358 on the left-hand side of sensor 550. Nevertheless, this configuration provides 16 edge leakage paths 140 and three field leakage paths 150. It can be seen that by changing the design to have different numbers of gate branches, shapes of active regions 210, and distribution of drains 230 and sources 250, much flexibility in the proportion of edge leakage 140 vs. field leakage 150 contributions is available. And sensor unit cells 550 can be tiled into arrays using the gate connections 356 and 358 to whatever size is required to achieve a certain level of sensitivity to TID.

Figure 13:
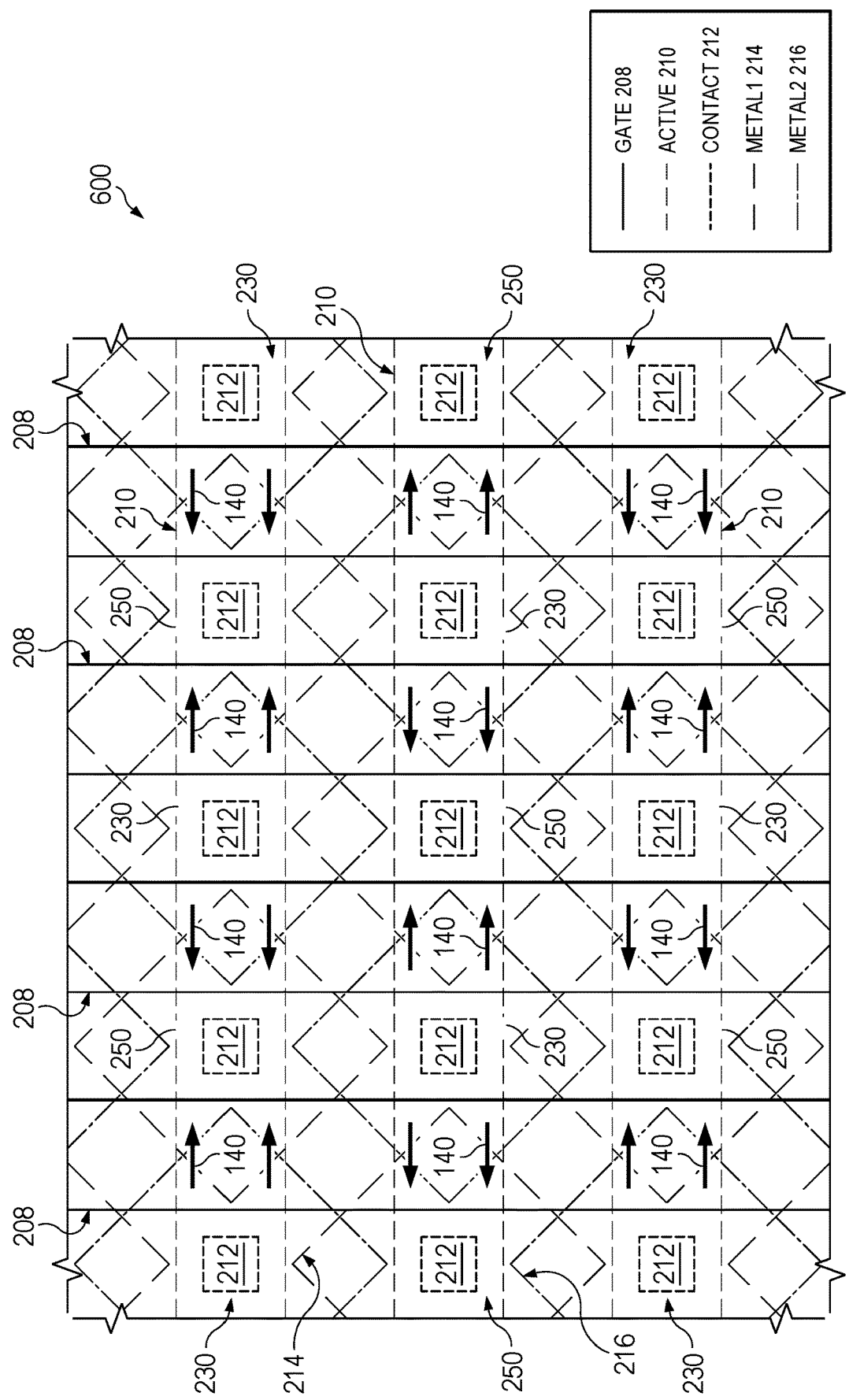
FIG. 13 is a schematic plan view or mask layout showing an array-type sensor having alternating drains and sources to create edge leakage paths and interconnects in the form of diagonal lattices.

Compact array TID sensors having a high density of parasitic edge leakage paths 140 per unit circuit area can be constructed using a strictly alternating array of drains 230 and sources 250 in both dimensions of a rectangular array. An example of such an array sensor 600 is shown in the mask layout of FIG. 13. To maximize density, minimum design rules may be applied to all of the structures and their overlaps. This will tend to result in a square array. Here a more detailed and realistic IC layout is shown than in earlier schematic layouts that used a minimum number of layers to illustrate the inventive concepts. Drains 230 and sources 250 are shown in a strictly alternating two-dimensional "checkerboard" pattern. Horizontal stripes of active 210 are separated by vertical gaps (i.e., spaced out and not touching) and contain rows of alternating drains 230 and sources 250 on either side of each gate 208 in each row. Alternate rows have drains 230 and sources 250 in reverse order so that the drains 230 and sources are alternating vertically as well as horizontally. Vertical stripes of gate 208 run between the drains 230 and sources 250 and separate the drains 230 and sources 250 to form a 2-D array of NMOS gate oxide transistors. Although not shown within the depicted portion of the array, these gates 208 are connected in parallel either in gate layer 208, which may be polysilicon, or by using contacts and one or more metal layers. A simple contact 212 is shown over each diffusion region (drains 230 and sources 250), although more layers and/or differing shapes may be required to comply with design rules for contacts to the two metal layers METAL1 214 and METAL2 216. All drains 230 are connected together using a diagonal mesh in METAL1 214; all sources 250 are connected together using an offset diagonal mesh in METAL2 216. The diagonal angle of the mesh strips needs not be 45 degrees, but it will likely be nearly so in order to efficiently interconnect a square array. Interconnect schemes other than a full mesh are possible, such as parallel diagonal lines of METAL1 214 and METAL2 216; but the two meshes as illustrated have the advantage of providing a low-resistance and fault-tolerant interconnect for the drains 230 and sources 250. In the layout of FIG. 13, it can be seen that there are two edge leakage paths 140, on either side of gate 208, between every drain 230 and source 250 along a horizontal row of active 210. However, this layout with strictly alternating drains 230 and sources 250 does not provide strong field leakage paths.

Figure 14:
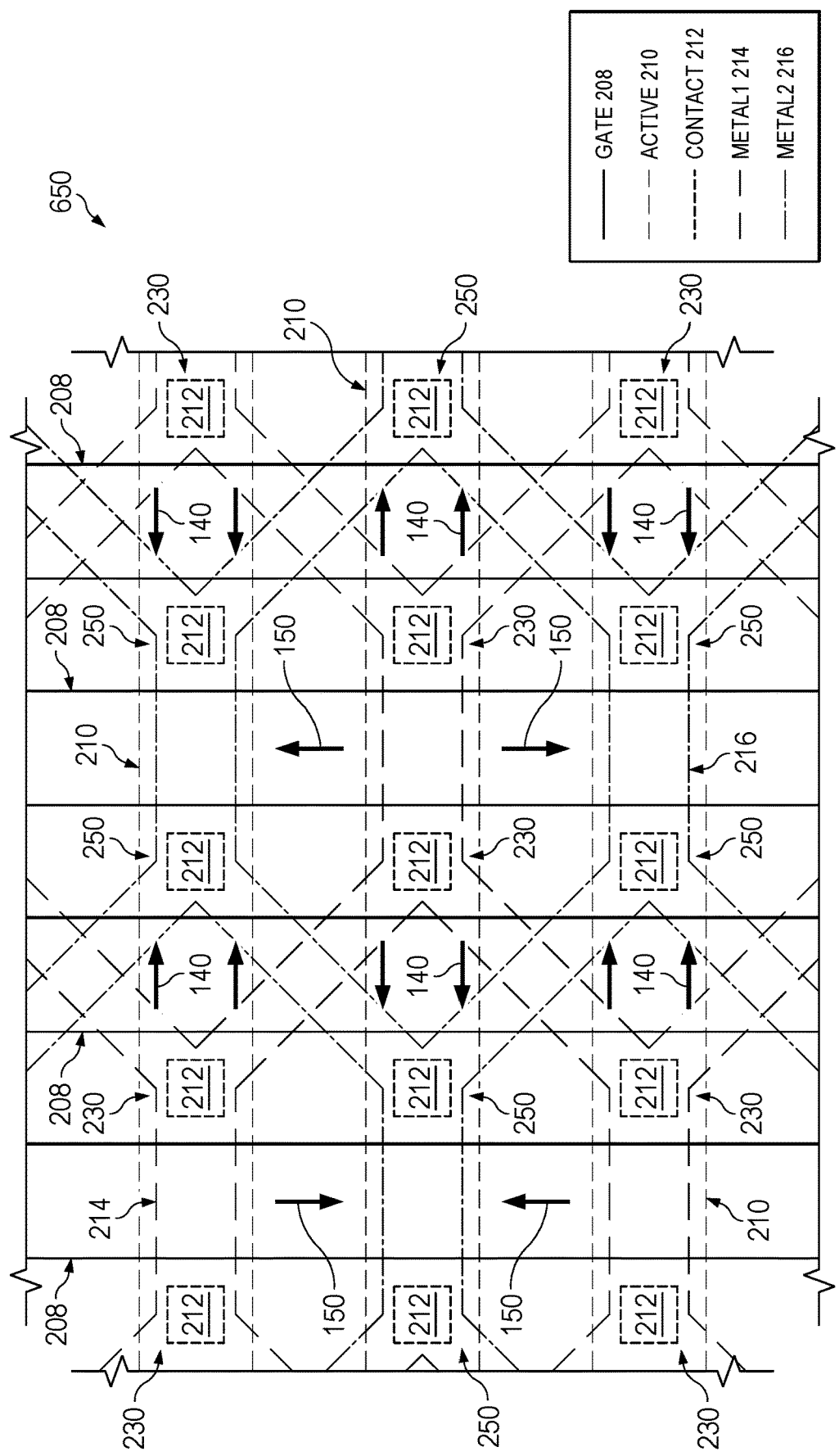
FIG. 14 is a schematic plan view or mask layout showing an array-type sensor having alternating pairs of drains and sources to create both edge leakage paths and field leakage paths.

Referring now to FIG. 14, a mask layout of a two-dimensional array sensor 650 having both edge leakage paths 140 and field leakage paths 150 is shown. In this layout, drains 230 and sources 250 alternate from row to row in the vertical direction, but are positioned in pairs along horizontal rows of active 210. Another way of describing this arrangement is that horizontal pairs of drains 230 and sources 250 are arranged as pairs (instead of as individual drains or sources) in a checkerboard arrangement. It can be seen that since there are no edge leakage paths 140 across gate stripes 208 that separate two drains 230 or two sources 250, there are half as many edge leakage paths 140 as in FIG. 13 in which drains 230 and sources 250 alternate in both directions; every other vertical gate stripe 208 has edge leakage paths 140. However, now field leakage paths 150 are created between the pairs of drains 230 and pairs of sources 250 in adjacent rows of active 210. Thus edge leakage paths 140 occur in every other gate stripe 208, while field leakage paths 150 occur in those gate stripes 208 in between those with edge leakage paths 140. In the layout of FIG. 14, four vertical gate stripes 208 and three horizontal active stripes 210 are shown, and as truncated, twelve edge leakage paths 140 and four field leakage paths 150 are shown within the area depicted. Mesh interconnects of drains 230 and sources 250 in the illustrated embodiment take the form not of simple diagonal square lattices, but of hexagonal meshes of METAL1 214 connecting drains 230 and METAL2 216 connecting sources 250. (Again, alternative interconnects are possible, not limited to the hexagonal meshes shown in FIG. 14.) The leakage current contributions of field leakage paths 150 can be increased by making those vertical stripes of gate 208 (such as the first and third from the left in FIG. 14) wider. To maximize the current contribution of edge leakage paths 140, the alternate gate stripes 208 (such as the second and fourth from the left in FIG. 14) can be made a minimum width according to allowable design rules in order to minimize their effective gate lengths $L_e$. Different arrangements of drains 230 and sources 250, and different widths of gate stripes 208 can be used to change the number, types, and contributions of parasitic leakage paths.

TID sensors made using NMOS transistors according to the teachings of the present disclosure can be used in shutdown circuits for compliance with export restrictions or to perform safety functions in medical or nuclear power applications. Their design flexibility allows tailoring of sensor response and sensitivity to TID, so that the present invention might also be used in dosimeters having calibrated or predictable response. Their simple fabrication and integration with other circuitry in existing commercial and/or rad-hard CMOS processes may facilitate the use of MOS TID sensors in a variety of medical, industrial, military, and aerospace applications.

While the present invention has been particularly shown and described in detail in the foregoing specification with reference to specific exemplary embodiments thereof, it will be evident that various modifications and changes may be made thereto without departing from the broader spirit and scope of the invention as set forth in the appended claims. For example, combinations of the exemplary embodiments may be made in multiple alternate ways to form more complex devices than illustrated in the figures herein. The specification and drawings are, accordingly, to be regarded in an illustrative rather than a restrictive sense.

We claim:

1. A metal oxide semiconductor (MOS) device for sensing total ionizing dose (TID) comprising:
   a silicon substrate having a top surface and an active region on the top surface;
   a field oxide layer formed above the substrate and surrounding the active region by a field oxide region such that there is a closed boundary between the active region and the field oxide region;
   a gate layer formed above the field oxide layer;
   a gate formed in the gate layer using a gate pattern that branches within the active region and crosses the boundary at a plurality of locations, such that the active region is divided into a plurality of diffusion regions disposed along the boundary and separated by the gate, the gate connected to a gate terminal;

a plurality of NMOS transistor drains formed in a first set of the diffusion regions, the drains coupled together and to a drain terminal;

a plurality of NMOS transistor sources formed in a second set of the diffusion regions disjoint with the first set, the sources coupled together and to a source terminal, the gate, drains, and sources acting together as a gate oxide transistor; and a number of parasitic edge transistors, each edge transistor formed along the boundary underneath the gate layer between a drain and a source, and acting in parallel with the gate oxide transistor, whereby a leakage current between the drain terminal and the source terminal increases with increasing TID.

2. The device of claim 1, wherein the number of edge transistors is at least four.

3. The device of claim 2, wherein the gate crosses the boundary at four locations, and drains and sources alternate along the boundary such that the number of edge transistors is four.

4. The device of claim 1, wherein the drains and sources alternate along the boundary, whereby the number of edge transistors is maximized.

5. A metal oxide semiconductor (MOS) device for sensing total ionizing dose (TID) comprising:
  a silicon substrate having a top surface, and a first active region on the top surface;
  a field oxide layer formed above the substrate and surrounding the first active region by a field oxide region, such that there is a first closed boundary between the first active region and the field oxide region;
  a gate layer formed above the substrate;
  a first gate formed in the gate layer using a first gate pattern that branches within the first active region and crosses the first boundary at a plurality of locations, such that the first active region is divided into a plurality of diffusion regions disposed along the boundary and separated by the first gate, the first gate connected to a gate terminal, the first active region comprising a set of one or more NMOS transistor drains formed in a first set of the diffusion regions, and a set of one or more NMOS transistor sources formed in a second set of the diffusion regions disjoint with the first set, the drains coupled together and to a drain terminal, and the sources coupled together and to a source terminal, the gate, drains, and sources acting together as a gate oxide transistor;
  the first active region comprising a set of one or more NMOS transistor drains formed in a first set of the diffusion regions, and a set of one or more NMOS transistor sources formed in a second set of the diffusion regions disjoint with the first set, the drains coupled together and to a drain terminal, and the sources coupled together and to a source terminal, the gate, drains, and sources acting together as a gate oxide transistor;
  at least one second region on the top surface adjacent to, but not contiguous with the first active region, the second region separated from the first active region by a field oxide region;
  at least one parasitic edge transistor, formed along the first boundary underneath the gate layer between a drain and a source, and acting in parallel with the gate oxide transistor; and
  at least one parasitic field transistor comprising a field gate over the field oxide region between the first active region and the second region, configured to act in parallel with the gate oxide transistor and parasitic edge transistors, whereby a leakage current between the drain terminal and the source terminal increases with increasing TID.

6. The device of claim 5, wherein the second region is a second active region having a second gate formed in the gate layer using a second gate pattern, with a pair of drains on either side of a portion of the second gate abutting the field gate, and the first active region has a pair of sources on either side of a portion of the first gate abutting the field gate.

7. The device of claim 5, wherein the second region is a second active region having a second gate formed in the gate layer using a second gate pattern, with a pair of sources on either side of a portion of the second gate abutting the field gate, and the first active region has a pair of drains on either side of a portion of the first gate abutting the field gate.

8. The device of claim 5, wherein the second region is an n-well, the field gate extends at least partly over the n-well, and the first active region has a pair of sources on either side of a portion of the first gate abutting the field gate.

9. The device of claim 5, wherein the field gate is formed in a metal layer over the field oxide layer.

10. A metal oxide semiconductor (MOS) device for sensing total ionizing dose (TID) comprising:
  an array of two or more TID sensors on a silicon substrate, the substrate having a top surface, a field oxide layer formed above the substrate, and a gate layer formed above the field oxide layer, each sensor comprising
    an active region on the top surface surrounded by a field oxide region in the field oxide layer such that there is a closed boundary between the active region and the field oxide region,
    a gate formed in the gate layer using a gate pattern that branches within the active region and crosses the boundary at a plurality of locations, such that the active region is divided into a plurality of diffusion regions disposed along the boundary and separated by the gate pattern, the gate connected to a gate terminal,
    one or more NMOS transistor drains formed in a first set of the diffusion regions, the drains coupled together and to a drain terminal,
    one or more NMOS transistor sources formed in a second set of the diffusion regions disjoint with the first set, the sources coupled together and to a source terminal, the gate, drains, and sources acting together as a gate oxide transistor, and
    a number of parasitic edge transistors, each edge transistor formed along the boundary underneath the gate layer between a drain and a source, and acting in parallel with the gate oxide transistor,
  wherein the sensors are connected electrically in parallel by coupling their drain terminals together to a common drain terminal, coupling their source terminals together to a common source terminal, and coupling their gate terminals together to a common gate terminal, whereby a leakage current between the common drain terminal and the common source terminal increases with increasing TID.

11. The device of claim 10, wherein the array is a two-dimensional array.

12. The device of claim 10, wherein coupling of the gate terminals of neighboring sensors in the array is accomplished by making the gates of the neighboring sensors contiguous.

13. The device of claim 10, further comprising at least one parasitic field transistor comprising a field gate over the field oxide layer between a first sensor and a second sensor in the array, configured to act in parallel with the gate oxide transistors and parasitic edge transistors.

14. The device of claim 13, wherein the field gate is formed in a region of the gate layer connecting the gate of the first sensor and the gate of the second sensor, the first sensor having a pair of drains on either side of a portion of its gate abutting the field gate, and the second sensor having a pair of sources on either side of a portion of its gate abutting the field gate.

15. The device of claim 13, wherein the field gate is formed in a metal layer over the field oxide layer between at least one source in the first sensor and at least one drain in the second sensor.

16. The device of claim 10, further comprising at least one parasitic field transistor comprising a field gate over the field oxide layer between at least one source in a first sensor and an n-well.

17. A metal oxide semiconductor (MOS) device for sensing total ionizing dose (TID) comprising:
 a silicon substrate having a top surface and a plurality of substantially parallel active regions on the top surface, the active regions elongated in a row direction and spaced out along a column direction;
 a field oxide layer formed above the substrate and surrounding each active region by a field oxide region such that there is a closed boundary between each active region and the field oxide region;
 a gate layer formed above the field oxide layer;
 first and second metal layers formed above the gate layer and insulated from each other and from the gate layer by interlevel dielectric;
 a plurality of substantially parallel gates formed in the gate layer and coupled together and to a gate terminal, the gates elongated in the column direction and spaced out along the row direction, each gate crossing a plurality of active regions such that each active region is divided into a plurality of diffusion regions separated by the gates;
 a set of NMOS transistor drains formed in a first set of the diffusion regions, the drains each having a drain contact, and coupled together and to a drain terminal by the first metal layer;
 a set of NMOS transistor sources formed in a second set of the diffusion regions disjoint with the first set, the sources each having a source contact, and coupled together and to a source terminal by the second metal layer, the gates, drains, and sources acting together as a gate oxide transistor, wherein the drains and sources are arranged to alternate along each active region in the row direction and to alternate along the gates in the column direction, such that the drains and sources are distributed in a checkerboard pattern; and
 a number of parasitic edge transistors, each edge transistor formed along the boundary underneath the gate layer between a drain and a source, and acting in parallel with the gate oxide transistor, whereby a leakage current between the drain terminal and the source terminal increases with increasing TID.

18. The device of claim 17, wherein at least a portion of the first metal layer is in the form of a first diagonal lattice crossing over the drain contacts to connect the drains, and at least a portion of the second metal layer is in the form of a second diagonal lattice crossing over the source contacts to connect the sources.

19. A metal oxide semiconductor (MOS) device for sensing total ionizing dose (TID) comprising:
 a silicon substrate having a top surface and a plurality of substantially parallel active regions on the top surface, the active regions elongated in a row direction and spaced out along a column direction;
 a field oxide layer formed above the substrate and surrounding each active region by a field oxide region such that there is a closed boundary between each active region and the field oxide region;
 a gate layer formed above the field oxide layer;
 first and second metal layers formed above the gate layer and insulated from each other and from the gate layer by interlevel dielectric;
 a plurality of substantially parallel gates formed in the gate layer and coupled together and to a gate terminal, the gates elongated in the column direction and spaced out along the row direction, each gate crossing a plurality of active regions such that each active region is divided into a plurality of diffusion regions separated by the gates;
 a set of NMOS transistor drains formed in a first set of the diffusion regions, the drains each having a drain contact, and coupled together and to a drain terminal by the first metal layer;
 a set of NMOS transistor sources formed in a second set of the diffusion regions disjoint with the first set, the sources each having a source contact, and coupled together and to a source terminal by the second metal layer, the gates, drains, and sources acting together as a gate oxide transistor, wherein the drains and sources are grouped in pairs of drains and pairs of sources, each pair of drains comprising a drain on either side of a gate in the row direction, and each pair of sources comprising a source on either side of a gate in the row direction, the pairs arranged to alternate along each active region in the row direction, and to alternate along the gates in the column direction, such that drains and sources are distributed as pairs in a checkerboard pattern;
 a number of parasitic edge transistors, each edge transistor formed along the boundary underneath the gate layer between a drain and a source; and
 a number of parasitic field transistors, each field transistor formed between a pair of drains and a pair of sources that neighbor each other in the column direction along a shared gate, the field transistors acting in parallel with the gate oxide transistor and the parasitic edge transistors, whereby a leakage current between the drain terminal and the source terminal increases with increasing TID.

* * * * *